(12) United States Patent
Prothero et al.

(10) Patent No.: US 12,009,876 B2
(45) Date of Patent: *Jun. 11, 2024

(54) FREQUENCY SPECTRUM ANALYZERS AND DEVICES, SYSTEMS, SOFTWARE AND METHODS FOR SIGNAL POWER MEASUREMENT AND SPECTRUM ANALYSIS

(71) Applicant: Astrapi Corporation, Dallas, TX (US)

(72) Inventors: Jerrold Prothero, Delray Beach, FL (US); Tanay Bhatt, Richardson, TX (US)

(73) Assignee: Astrapi Corporation, Dallas, TX (US)

( * ) Notice: Subject to any disclaimer, the term of this patent is extended or adjusted under 35 U.S.C. 154(b) by 281 days.

This patent is subject to a terminal disclaimer.

(21) Appl. No.: 17/530,445

(22) Filed: Nov. 18, 2021

(65) Prior Publication Data

US 2022/0077941 A1 Mar. 10, 2022

Related U.S. Application Data

(63) Continuation-in-part of application No. 17/099,643, filed on Nov. 16, 2020, which is a
(Continued)

(51) Int. Cl.
*H04B 17/23* (2015.01)
*H04B 17/26* (2015.01)

(52) U.S. Cl.
CPC ............. *H04B 17/23* (2015.01); *H04B 17/26* (2015.01); *G06F 2218/02* (2023.01)

(58) Field of Classification Search
CPC ......... H04B 17/23; H04B 17/26; H04L 27/00; H04L 27/02; H04L 27/2697;
(Continued)

(56) References Cited

U.S. PATENT DOCUMENTS 5,706,202 A 1/1998 Itahara
9,426,680 B2 8/2016 Itron
(Continued)

OTHER PUBLICATIONS

Chu Haobing et al: "Is spiral modulation really useful?", Jan. 1, 2017, pp. 1-69, XP093043470, DOI: 10.14288/1.0340494, URL:https://open.library.ubc.ca/media/stream/pdf/24/1.0340494/4.
(Continued)

*Primary Examiner* — Steven S Kelley
(74) *Attorney, Agent, or Firm* — Law Office of Michael Antone, LLC; Michael Antone

(57) ABSTRACT

Systems, devices, software, and methods of the present invention enable frequency-based signal power analyses in software suitable for signal with either stationary and non-stationary spectrums. The methods that may be used throughout various systems including transmitters receivers, repeater, controllers, monitors, etc. and in software simulators to enable various signal power calculations and analyses, such as frequency spectrum analysis, throughout operating systems and that may be consistently applied in system design and operation simulations in a wide range of applications, such as interference and spectrum monitoring or clearance, object tracking, transmission channel and noise analyses, radiated power analysis, signal boundary interference, satellite downlink signal identification, pulsed radar monitoring, audio detection and identification, lidar systems, sonar systems, etc.

18 Claims, 15 Drawing Sheets

Related U.S. Application Data continuation-in-part of application No. 16/819,126, filed on Mar. 15, 2020.

(60) Provisional application No. 62/848,280, filed on May 15, 2019.

(58) Field of Classification Search
CPC . H04L 27/3494; H04L 27/3405; H04L 43/16; H04W 16/14; H04W 24/08; G06F 2218/02

See application file for complete search history.

(56) References Cited

U.S. PATENT DOCUMENTS

| | | | |
|---|---|---|---|
| 11,876,569 B2* | 1/2024 | Prothero | G01R 23/165 |
| 2011/0150048 A1* | 6/2011 | Prothero | H04L 27/2697 |
| | | | 375/211 |
| 2016/0119806 A1* | 4/2016 | Carbajal | H04W 72/0453 |
| | | | 455/67.11 |
| 2016/0149744 A1* | 5/2016 | Prothero | H04L 27/3494 |
| | | | 375/259 |
| 2016/0323135 A1* | 11/2016 | Prothero | H04L 27/3494 |
| 2017/0063591 A1* | 3/2017 | Prothero | H04L 27/2639 |
| 2018/0091336 A1 | 3/2018 | Mody | |
| 2020/0220766 A1* | 7/2020 | Prothero | H04L 27/3494 |
| 2020/0366389 A1* | 11/2020 | Prothero | H04B 17/318 |

OTHER PUBLICATIONS

Matthew T Hunter et al: "Design of a 1-15 software defined, FPGA-based reconfigurable RF Measuring Receiver", AUTOTESTCON, 2009 IEEE, IEEE, Piscataway, NJ, USA, (Sep. 14, 2009), pp. 374-379, XP031560304, ISBN: 978-1-4244-4980-4.

Gil Savir: "Scalable and Reconfigurable 1-15 GO1R Digital Front-End for SDR Wideband H04B Channelizer", MSc Thesis, Sep. 25, 2006 (Sep. 25, 2006), pp. 1-69, XP055020395, Delft, NL URL:http://ce.et.tudelft.nl/publicationfiles/1206_716_Gil_Savir-MSc_thesis.pdf chapters 2-4.

* cited by examiner

FREQUENCY SPECTRUM ANALYZERS AND DEVICES, SYSTEMS, SOFTWARE AND METHODS FOR SIGNAL POWER MEASUREMENT AND SPECTRUM ANALYSIS

CROSS-REFERENCE TO RELATED APPLICATIONS

This application is a continuation-in-part of U.S. patent application Ser. No. 17/099,643 filed 2020 Nov. 16, which is a continuation-in-part of U.S. patent application Ser. No. 16/819,126 filed 2020 Mar. 15, which claims the benefit of and priority to U.S. Provisional Patent Application No. 62/848,280, filed on May 15, 2019, entitled "Devices, Systems, And Software Including Signal Power Measuring And Methods And Software For Measuring Signal Power", the entire disclosure of each is hereby incorporated by reference.

STATEMENT REGARDING FEDERALLY SPONSORED RESEARCH OR DEVELOPMENT

This invention was made with government support under Award #1738453 awarded by the National Science Foundation. The government has certain rights in the invention.

BACKGROUND OF THE INVENTION

Field of the Invention

The present invention relates in general to measuring signal power, and, more specifically to frequency spectrum analyzers, systems, devices, software, and methods to perform signal power measurements over a frequency spectrum for use in occupied bandwidth (OBW), Bit Error Rate (BER), signal-to-noise ratio (SNR), and other frequency spectrum analyses.

Background Art

The data transmission capacity of a communication system depends generally on the number of communication channels that the system can support and the data transmission capacity of each communication channel. The number of channels that may be used in a given frequency range depends upon the frequency range, or bandwidth, that is occupied by each channel being transmitted or received by the system, which is known as the occupied bandwidth (OBW) of the channel. System channel layouts are based on a maximum expected OBW for each channel along with an additional guardband to determine the channel spacing as typically defined by the frequency range separating the center frequency of each channel.

Spectrum analyzers are used to measure the OBW of a signal being transmitted in a transmission system, e.g., optical, radio, etc., as well as in systems for determining the origin and/or type of signal being received by monitoring systems, e.g., surveillance, radar, lidar, sonar, etc. In monitoring applications, the ability to detect and identify the properties of a signal and the signal source is very important.

A standard convention is to equate the OBW of a signal to the range of frequencies which contain 99% of the signal power for that signal. This or similar definitions of OBW require measuring signal power across frequencies, to get a power spectral density (PSD). As known to those of ordinary skill, the OBW calculations typically do not include frequencies in which the power is below a minimum amount, e.g., a noise floor.

The most commonly used current methods of spectral analysis employ Fourier Transform (FT) methods, which are well-known in the art. However, FT methods represent the signal spectrum in terms of sinusoids with constant amplitude, i.e., as a stationary spectrum. The stationary spectrum requirement means the FT methods inherently cannot correctly measure OBW, or more generally, PSD, if the spectrum is changing over time, i.e., is not stationary, particularly if the spectrum is changing rapidly. As such, transmission and monitoring systems that require the use of current spectral analysis methods for system design and signal analysis are inherently limited by FT-based systems that do not work well with signals that are changing over time.

The study of time-frequency analysis arose because of this problem and includes such techniques as the short-time Fourier Transform (STFT), generating the well-known spectrogram. STFT uses a sliding time-window, with a trade-off between time and frequency resolution. Joint time-frequency distributions are an alternative technique, in which a function is derived that is distributed simultaneously in the time and frequency domains. However, all of these techniques are based on the FT, which, despite sophisticated adaptations, is fundamentally not suited to the study of a time-varying spectrum. Effectively, applying the FT to a time-varying (non-stationary) spectrum requires finding time periods over which the spectrum can be considered to be approximately stationary (so that the assumptions of the FT are met) then stitching them together. Unfortunately, a priori knowledge of approximately stationary intervals is generally not known, which may be one of the reasons that the spectrum is being measured. Use of such approximately stationary intervals requires subdividing the signal across its entire frequency range, and if more accuracy is desired, the subdivisions must become smaller, thus very significantly increasing the number of computations that must be used to perform the analysis, thus leading to undesirable tradeoffs between accuracy and available computer power.

Real time spectrum analyzers ("RTSAs") capture signals over short intervals, which are then stored and analyzed using Fast Fourier Transform (FFT) algorithms. Some RTSAs may sequence the FFT results to show changes in the spectrum over time.

The stationary assumption becomes increasingly unworkable as the spectrum becomes increasingly non-stationary, as, for instance, in the case of signals generated using spiral modulation, which are continuously non-stationary. For additional information on spiral modulation, see, for example, U.S. Pat. No. 8,472,534 entitled "Telecommunication Signaling Using Non-Linear Functions", U.S. Pat. No. 8,861,327 entitled "Methods and Systems for Communicating", and U.S. Pat. No. 10,069,664 entitled "Spiral Polynomial Division Multiplexing" (SPDM), the contents of which are herein incorporated by reference in their entirety, except for the claims and any disclosure contrary to this disclosure, and Prothero, J., Islam, K. Z., Rodrigues, H., Mendes, L., Gutiérrez, J., 86 Montalban, J. (2019), Instantaneous Spectral Analysis. *Journal of Communication and Information Systems*, 34(1), 12-26, doi.org/10.14209/jcis.2019.2.

A different approach to OBW and PSD measurement known to the art is the hardware swept-tuned spectrum analyzer (HSTSA). Essentially, the HSTSA analyzes a physically-transmitted signal and uses filters to successively isolate particular frequency ranges ('bins') of the spectrum.

The power in each frequency bin is measured, and the distribution of power across frequency bins can be used to measure the OBW.

Since the HSTSA does not use an FT, it inherently avoids the problems with FT-based OBW measurement described above. However, since the HSTSA sweeps through a frequency range, the assumption of a stationary spectrum remains over the duration of the sweep. In addition, the HSTSA requires physical signal transmission and is often an expensive piece of equipment that is not easily used outside of the laboratory or in the design phase.

The continuing demand for higher performance services from communication service customers of all types means there is a continuing need for data transmission/communication systems, device, software, and methods to enable those services.

BRIEF SUMMARY OF THE INVENTION

Spectrum analyzer devices, and systems, devices, software, and methods of the present invention enable spectral analysis and other frequency-based signal power analyses of stationary spectrum and non-stationary spectrum signals without requiring all of the hardware required by HSTSA and the stationary spectrum limitations of FFT-based analyzers. The present invention provides a software-based spectrum analyzer ("SSA") that solves long-standing problems associated with making consistent spectrum measurements and enables spectrum analysis to be performed on both hardware and software generated signals regardless of whether the spectrum of the signals is stationary or non-stationary. In hardware, the present invention may be used to enable system design, feedback, and control based on the actual OBW performance of the operational transmission and signal monitoring systems. In software, the SSA may be used in software simulators to evaluate the simulated system performance, such as analyzing the OBW of simulated signals. Because the present invention may be applied to hardware 86 software generated signals, analyses may be performed consistently across hardware and software platforms.

The present invention is particularly useful for signals where the spectrum to be measured is highly time-variant (non-stationary), because of the limitations of FT-based techniques. However, the methods are generally applicable and may be employed in combination with, or in lieu of, FT-based techniques on stationary spectrum signals.

Frequency spectrum analyzers, systems, devices, and methods of the present invention have an electrical signal input, which may have been generated in hardware by receiving an information carrying signal, e.g., an optical or radio frequency signal, using a receiver suitable for the electromagnetic wave frequency being received, or in software by simulating the preceding reception. One particular example of the use of this invention is with radar systems needing to carefully pinpoint the location and movement of an object. The system transits its beam of energy at a known frequency and then receives return signals from objects which the transmission beam will have encountered. These return signals will have been doppler shifted in frequency depending on the speed at which the object is moving and the direction of its movement relative to the radar transmitter. Thus, the return spectrum will be non-stationary. This invention is able to accurately detect very small energy returns that many radar systems cannot detect at all because they are close to the background noise level and can also dramatically improve the discrimination between frequencies that are very close together. These abilities of the invention enable a radar system using the invention to discriminate between objects that are very close together, thus increasing the ability of a radar system to discriminate between multiple close targets. When paired with information from the radar about the direction from which a particular return signal was received, this invention enables a large increase in the ability of a radar system to pinpoint the location of an object that was seen by the radar. The analysis of the input signal may be performed pursuant to various analysis inputs provided by the user. For example, prior to analyzing the input signal, the user may specify a frequency spectrum range having a minimum frequency (f_min) and a maximum frequency (f_max) and define at least one frequency bin within the frequency spectrum range and having a frequency bin width, f_width, and a source frequency, f_source, associated with each frequency bin.

A target intermediate frequency (f_target) may be specified for each frequency bin. The target frequency may be the same for each frequency bin, or may be varied by the skilled artisan. In some applications, it may be desirable to make the target intermediate frequency the same for all frequency bins, so the same filter may be used for each bin.

An input signal sample time interval, dt, defining a sampling frequency, Fs=1/dt, is chosen. Also relevant is the total number of samples in the signal, sig_len. For each frequency bin, a software intermediate frequency bandpass filter, ifbpf, in terms of Fs, f_target, and f_width, may be defined along with an input signal software bandpass filter, INbf, to remove frequencies outside of the passband.

In operation, an input signal SIGin is received, having power distributed over a signal frequency range. The input signal software bandpass filter, INbf, may be applied to the input signal SIGin to produce a filtered input signal, SIGin_filtered, which may be normalized to produce a normalized signal power, SIGin_norm, which may be stored for use in various calculations.

For each frequency bin, a mixing frequency, f_mix, appropriate for translating from the frequency source f_source to the target IF frequency, f_target, may be calculated as f_mix=f_source−f_target.

A mixing stream or sequence, cos_mix, of length sig_len equal to the input signal length may then be calculated by evaluating the cosine function over the range from 0 to rads_per_signal in increments of rads_per_sample, which may be written as:

$$\text{cosmix}=\{\cos(0),\cos(\text{rads\_per\_sample}),\cos(2*\text{rads\_per\_sample}),\cos(3*\text{rads\_per\_sample}),\ldots\cos(\text{rads\_per\_signal})\}$$

where $$\text{rads\_per\_sample}=f\_\text{mix}*dt*2*pi, \text{ and}$$

$$\text{rads\_per\_signal}=\text{rads\_per\_sample}(\text{sig\_len}-1)$$

or in shorthand MATLAB® notation as:
cos_mix=cos(0:rads_per_sample:rads_per_signal) The mixing stream, cos_mix, calculation results in a sequence of length rads_per_sample. The above equation for cos_mix may be implemented by one of skill in the art using software, e.g., MATLAB®, which provide such functions, or via custom code.

An intermediate frequency (IF) signal, sig_IF, may be generated by using the formula, sig_IF=SIGin_norm*cos_mix for each frequency bin.

The corresponding intermediate frequency bandpass filter, ifbpf, may be applied to each intermediate frequency (IF) signal, sig_IF, to generate a filtered IF signal, sig_IF_filtered for each frequency bin.

A bin power value, bin_power, in the filtered IF signal sig_IF_filtered, may be calculated by summing the square of the amplitudes in sig_IF_filtered and dividing this sum by the time interval, and storing the resulting value for each bin.

The frequency bin having the maximum bin_power, max_power, may be identified and used for various purposes. For example, the occupied bandwidth of the input signal may be calculated in various ways, such as by summing the frequency widths of frequency bins based on the bin power, bin_power, in each frequency bins proximate to the frequency bin with maximum power. Another example would be in applications where there may be more than a single frequency of interest in the total frequency range of the spectrum being examined, such as in radar returns where several objects may be picked up by the transmitted signal and each returns its own frequency signature due to the doppler shifting due to its individual speed and orientation to the radar transmitter. In this case, the calculations may be designed to note when there is an unexpected spike upwards in the energy in one or more frequency bins off some number of bins away from the bin with max_power when only declining amounts of power would have been expected in such bin(s) if there had been only a single object detected, thus indicating that there is one or more other objects in the returned radar beam.

In various embodiments, the OBW may be calculated as a two-sided occupied bandwidth of the input signal by starting with the frequency width of the maximum power bin, then successively summing the frequency widths of the frequency bins with highest power adjacent on either side to the maximum power bin or to a previously summed frequency bin based until the sum of the power in the frequency power bins is equal to 99% or some desired percentage of the input signal power. The single-sided occupied bandwidth may be calculated by dividing the two-sided occupied bandwidth by two to provide an average or by summing the power in frequency bins spanning lower and higher frequencies, respectively, than the frequency bin with the maximum power.

Systems, devices, software, and methods of the present invention may be applied at many, if not all, of the various design and operational stages. In design stages, the present invention may be implemented in simulation software, as well as in the device and system level design and prototypes. In operation, the present invention may be implemented in transmitters, repeaters, receivers, stand-alone signal monitoring devices and other devices used in various applications and systems in which in signal power measurements over a frequency spectrum may be of use. Exemplary applications may include interference monitoring, spectrum clearance and/or monitoring, tracking, transmission channel and noise analysis, radiated power analysis, signal boundary interference, satellite downlink signal identification, pulsed radar monitoring, bird chirp detection and identification, etc.

As may be disclosed, taught, and/or suggested herein to the skilled artisan, the improvements in spectrum analyzers provided by the present invention addresses the continuing need for hardware and/or software systems, devices, and methods that measure signal power, such as the OBW of signals, in software simulation or hardware transmission. These improvements may be particularly of importance in the case of a highly non-stationary spectrum, where the underlying assumptions of FFT-based spectrum analyzer solutions breakdown.

BRIEF DESCRIPTION OF THE DRAWINGS

Advantages of embodiments of the present invention will be apparent from the following detailed description of the exemplary embodiments thereof, which description should be considered in conjunction with the accompanying drawings, which are included for the purpose of exemplary illustration of various aspects of the present invention to aid in description, and not for purposes of limiting the invention.

Figure 1:
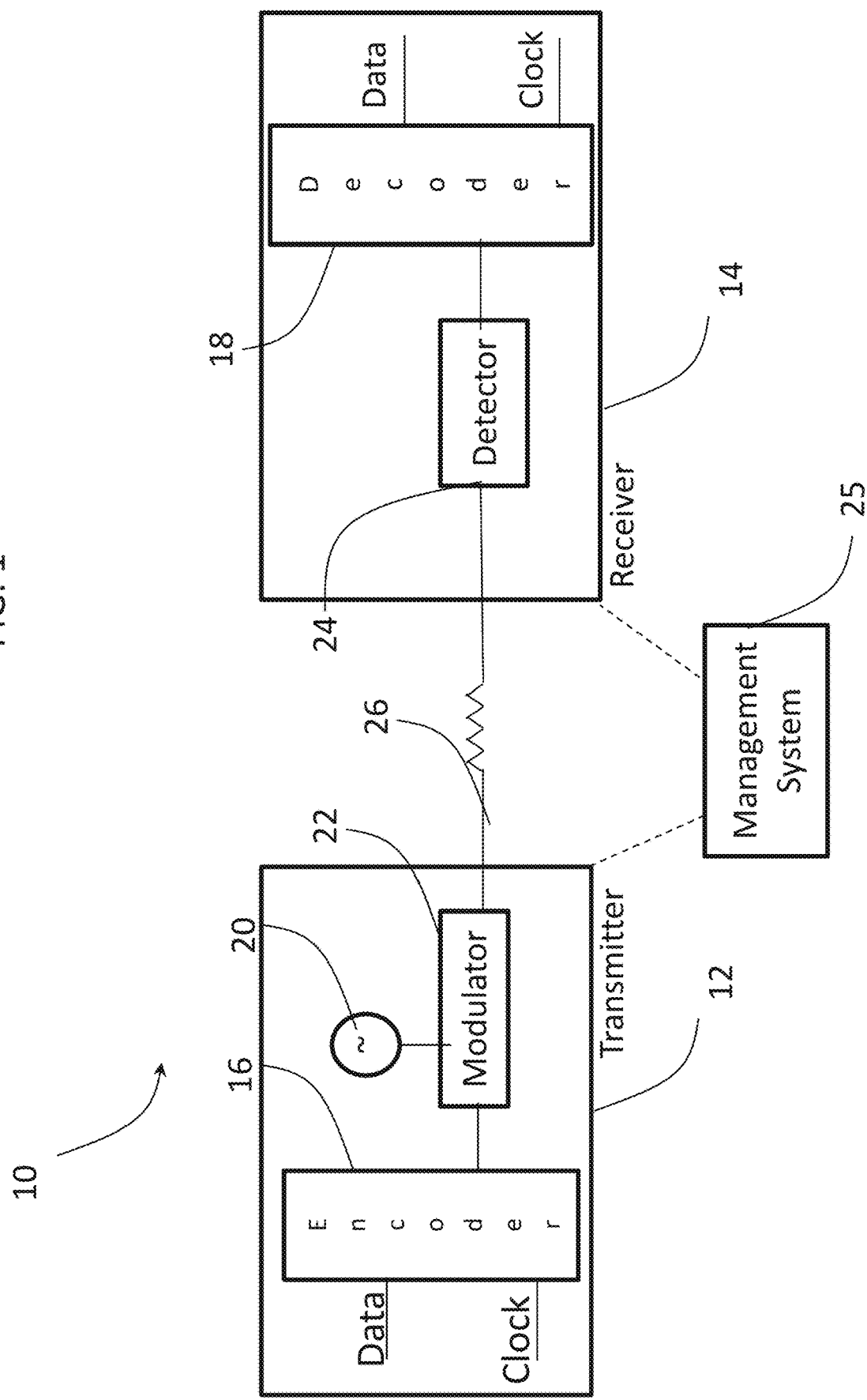
FIG. 1 illustrates exemplary data transmission systems.

In the drawings and detailed description, the same or similar reference numbers may identify the same or similar elements. It will be appreciated that the implementations, features, etc., described with respect to embodiments in specific figures may be implemented with respect to other embodiments in other figures, unless expressly stated, or otherwise not possible.

DETAILED DESCRIPTION OF THE INVENTION

Aspects of the invention are disclosed in the specification and related drawings, which may be directed to specific embodiments of the invention. Alternate embodiments may be devised without departing from the spirit or the scope of the invention. Additionally, well-known elements of exemplary embodiments of the invention will not be described in detail or will be omitted so as not to obscure the relevant details of the invention. Further, to facilitate an understanding of the description, a discussion of several terms used herein may be included.

Figure 2:
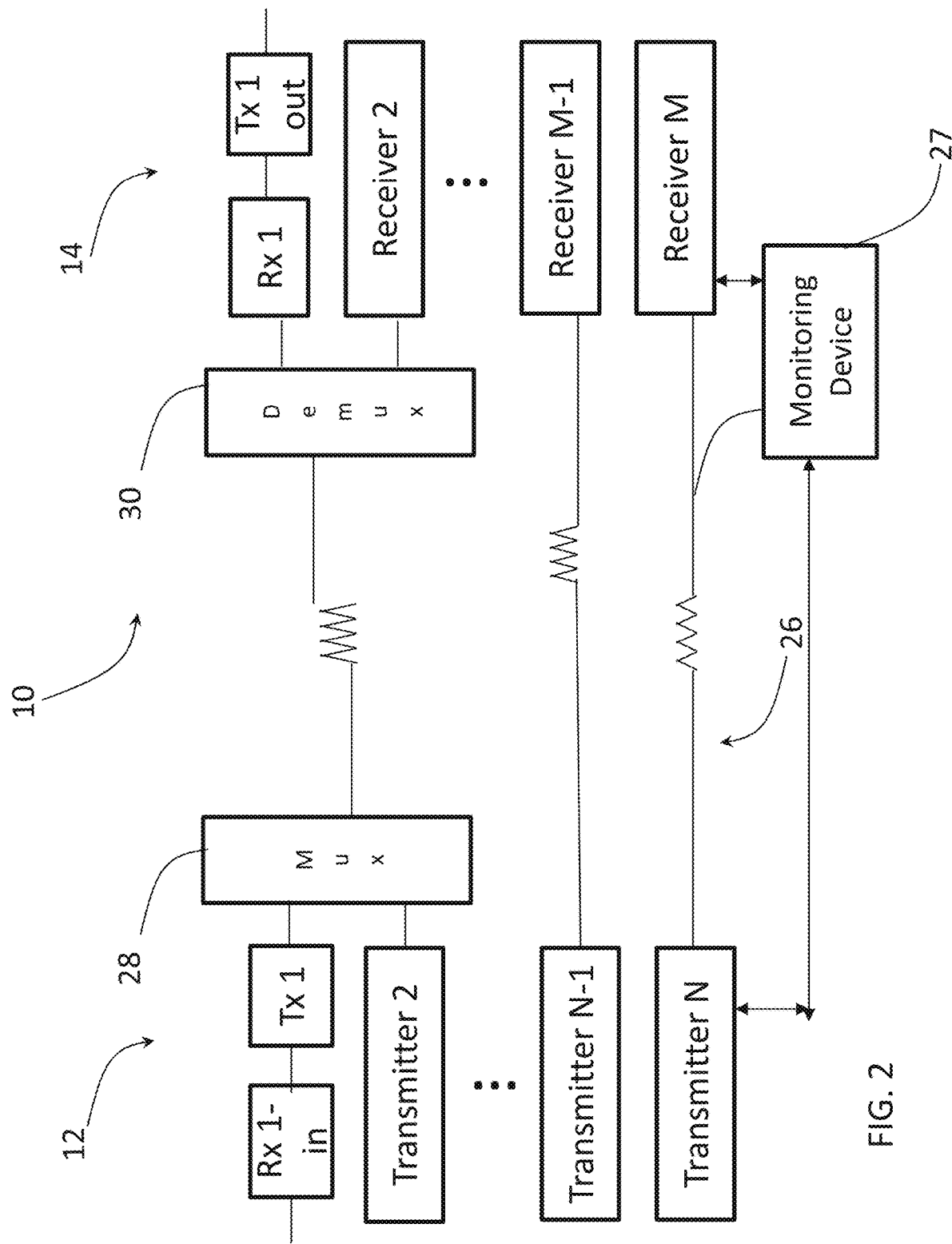
FIG. 2 illustrates exemplary data transmission systems.

FIG. 1 shows exemplary systems 10 including exemplary transmitter 12 and receiver 14 pairs that may be used in transmission or communication systems, such as further shown in FIG. 2. Bits, usually representing data/information, to be transmitted as a signal through the system 10 may be encoded in a channel encoder 16 section of the transmitter 12, as well as have other signal processing performed to prepare a signal for transmission. The encoded bits may then be used to modulate a carrier wave having a center frequency provided by a carrier source 20, or frequency source, using an external modulator 22 as shown in FIG. 1 or to directly modulate the carrier/frequency source 20 to produce the transmission signal. The signals may be transmitted using one carrier or multiple carriers simultaneously, such as when implemented with Instantaneous Spectral Analysis ("ISA"), see U.S. Pat. No. 10,069,664 incorporated above.

The encoder 16 and decoder 18 are shown as single blocks in FIG. 1. However, the encoder 16 and decoder 18 may include one or more stages/components that are used to process the information passing through the system 10. The encoding and decoding function may be performed inside and/or outside the transmitter 12 and receiver 14, as desired by the skilled artisan.

At the receiver 14, a detector 24 may detect the transmission signal and provide the transmission signal to signal processors, which may include the decoder 18 to perform any decoding necessary to output the bits. The bits output from the system 10 may be in the form of data and clock signals, or otherwise. In various embodiments, the system 10 may be locally and/or remotely monitored and/or controlled by a management system 25 as is known in the art. The system 10 may be deployed as part of a local private point-to-point network, as well as part of the global terrestrial and satellite infrastructure and managed accordingly.

FIG. 2 shows exemplary systems 10 that include a plurality of transmitters 12 and receivers 14 that may be deployed in various transmission and communication systems employing various wired and wireless transmission media 26 and may include technologies employing the present invention. Signal monitoring may be performed at the transmitters, receivers, amplifiers/repeaters, and other devices in the system 10 and/or with stand-alone signal monitoring devices 27 deployed at various locations in the system 10. In various devices, the present invention may be implemented as software, including firmware, embedded logic, etc., that is stored in a computer readable medium, such as memory, drives, and other storage devices and executed by process running proximate (on or near) the devices as is known in the art.

The signal monitoring device 27 may be embodied as a frequency spectrum analyzer that may provide PSD information as feedback to transmitters and/or receivers in hardware systems for adjusting parameters in the transmitter and receivers for the transmission and reception, as well as to store and/or display the frequency PSD to users of the system 10.

In the system design phase, users of the signal monitoring device 27 may display and use the PSD information to identify and select waveforms and other transmitter and receiver parameters based on hardware system testing and/or software simulation.

Systems 10, such as shown in FIG. 1 and FIG. 2 and other systems, may be deployed in various electrical and optical wired transmission and communication networks, as well as satellite and terrestrial wireless networks In various systems, the transmission signals may be multiplexed in a multiplexer 28 before transmission and may require demultiplexing before detection in a demultiplexer 30 after transmission, as is commonly performed in wired and wireless systems carrying multiple channels. As is known, the input signals to the systems 10 may include various multiplexed signals from the same or different sources and systems and may transmit one data stream as one or more data streams through some or all of the system.

Figure 17:
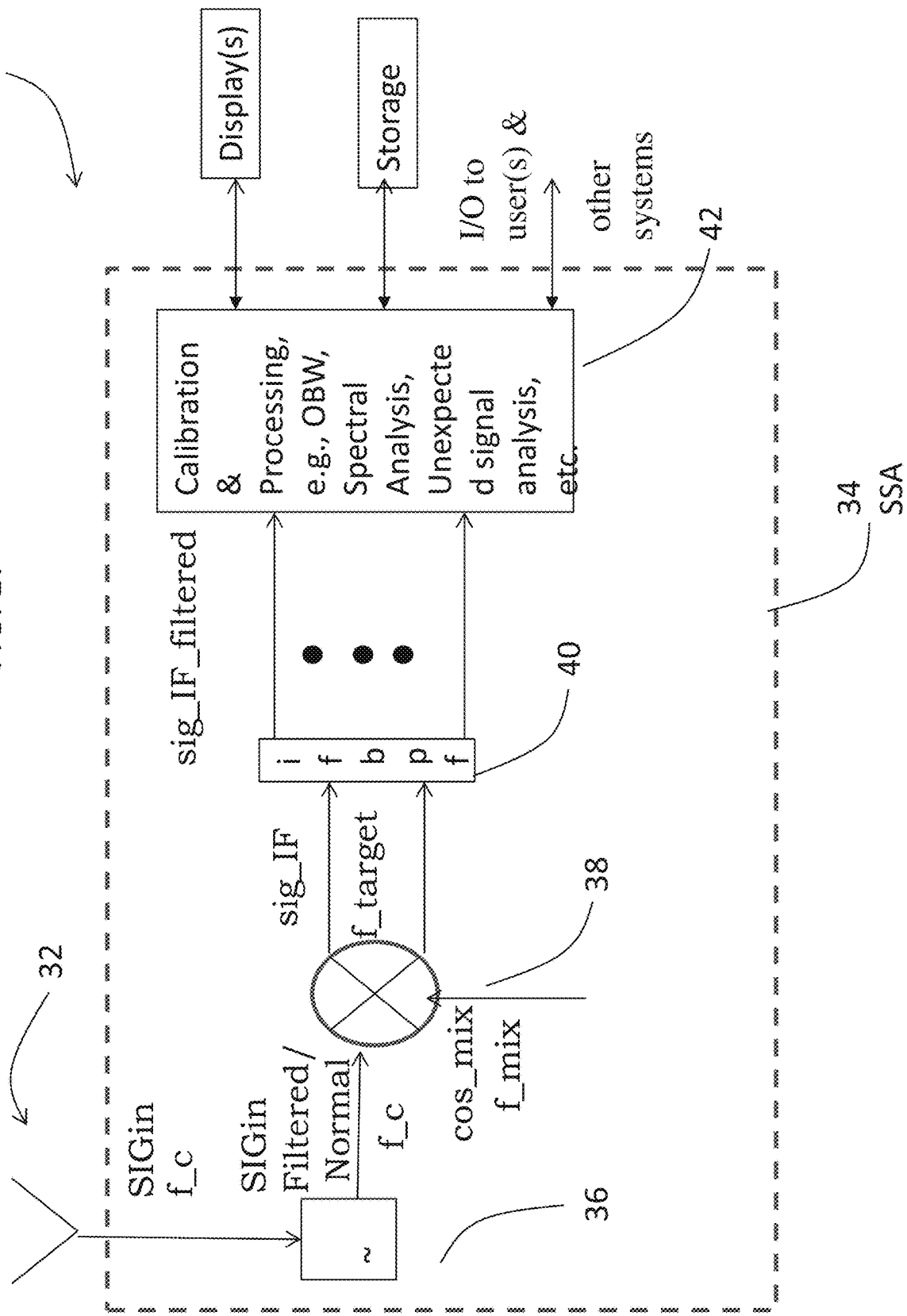
FIG. 17 depicts exemplary embodiments of systems and spectrum analyzer employed for interference and spectrum monitoring and clearance applications.
Figure 18:
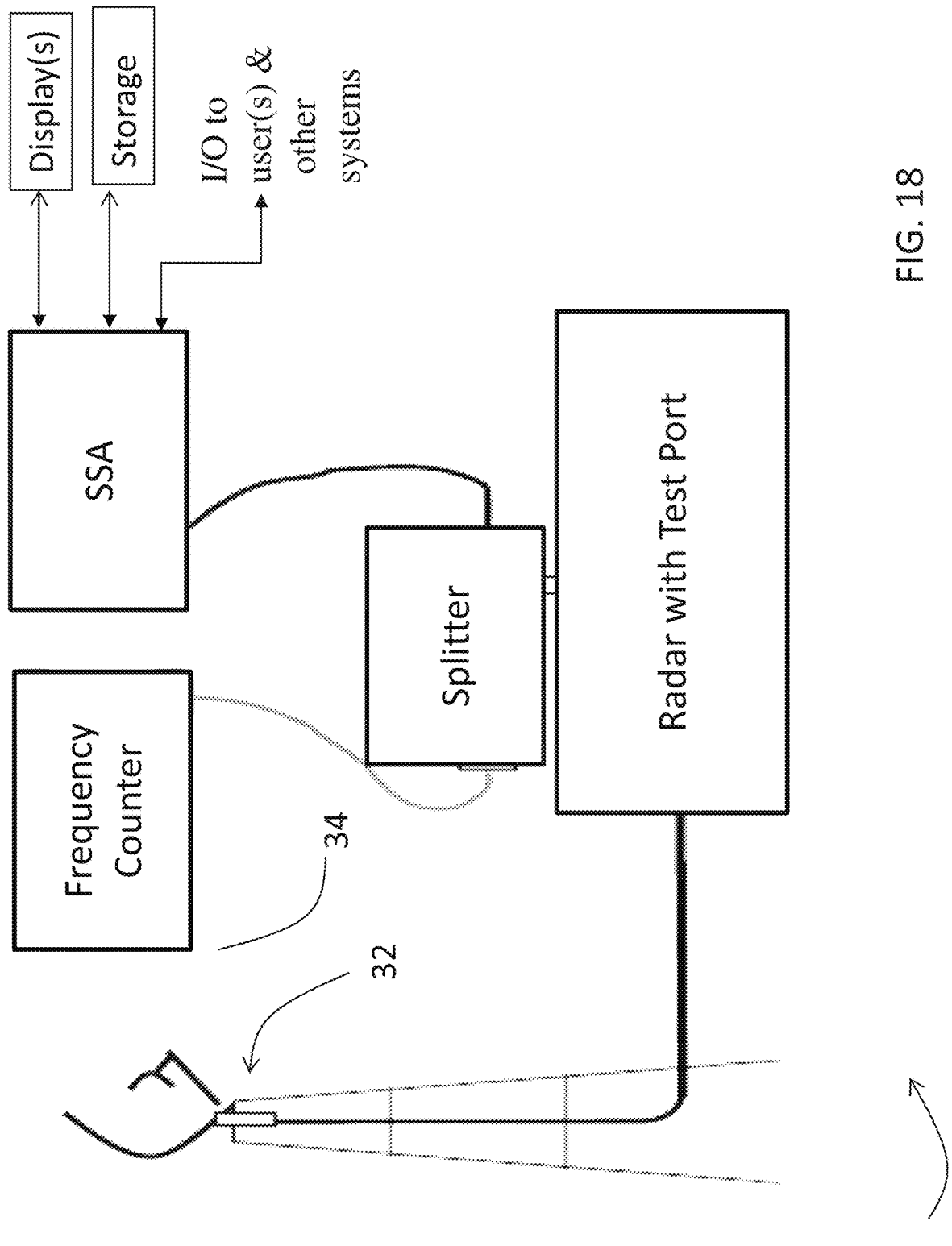
FIG. 18 shows embodiments of systems and spectrum analyzer employed for spectrum monitoring applications such as in a radar system.
Figure 19:
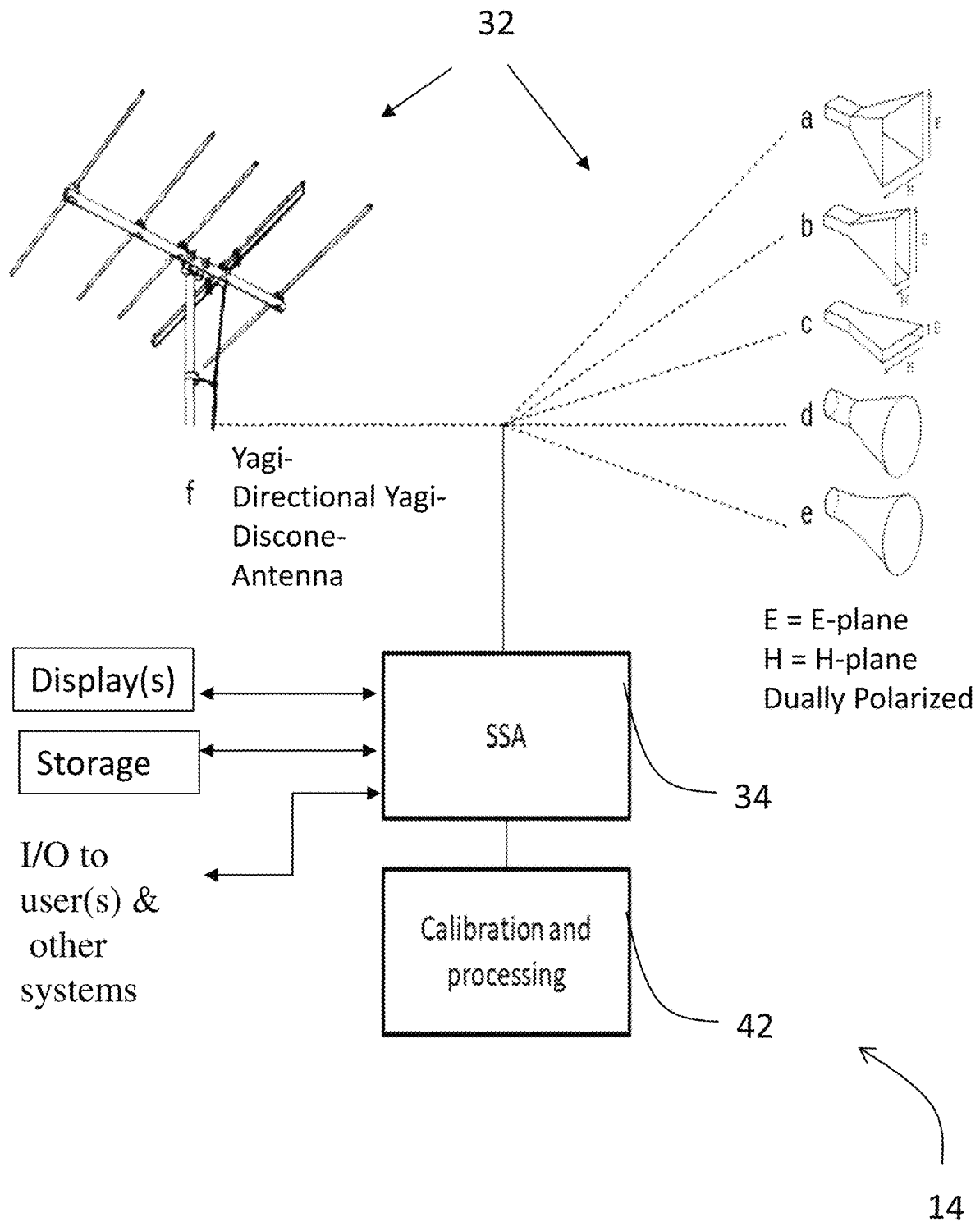
FIG. 19 shows embodiments of spectrum analyzers and analyzer systems in a stand-alone configuration for use with one or more transmission and monitoring systems.

Systems, devices, and methods of the present invention have an electrical signal input, which may have been generated in hardware by receiving a data/information carrying signal, e.g., optical or radio frequency signals, in a receiver suitable for the electromagnetic wave frequency being received or in software by simulating the preceding reception. An optical to electrical converter, such as a photodiode, may be employed for direct, homodyne, or heterodyne detection and conversion of optical signals into the electrical signals. For RF signals, an antenna may be employed as shown in FIGS. 17-19.

The analysis of the input signal may be performed pursuant to various analysis inputs provided by the user. For example, prior to analyzing the input signal with a center frequency, f_c, the user may specify a frequency spectrum range (f_range) having a minimum frequency (f_min) and a maximum frequency (f_max). Because the analysis is being performed in software and the input signal may be stored, the user may be able to vary the frequency range (f_range) of interest and re-run the analysis to assess the sensitivity of the analysis to various user inputs. One of skill in the art will appreciate that a range of user inputs may provide suitable results; however, increasing the number of calculations performed to produce the results may impact the latency of the results.

The user may define at least one frequency bin within the frequency spectrum range (f_range) and having a frequency width, f_width. This may be done by specifying the number of frequency bins and segmenting the frequency range (f_range) of interest accordingly. The width of each frequency bin is termed f_width. It is usually desirable to segment the frequency range evenly from an efficiency and ease of use standpoint, but there may be scenarios where one of ordinary skill may prefer to unevenly segment the frequency range, such as in frequency ranges where the signal power is expected to change rapidly (narrow bins) or not change significantly (wide bins).

For each frequency bin, a target intermediate frequency (f_target) and corresponding software intermediate frequency bandpass filter, ifbpf, in terms of f_target, sampling frequency, Fs, and f_width may be defined. Various target intermediate frequencies may be selected by the skilled artisan depending upon the particular application of the present invention. In various embodiments, the target frequency for each frequency bin may be the same.

The use of intermediate target frequencies enables the skilled artisan to translate the signal power to a lower frequency. For example, for RF signals in the range of 900 MHz, target intermediate frequencies may be in the range of 100 KHz. The intermediate frequency bandpass filter may be implemented using various techniques as known to those of skill in the art. For example, using the MathWorks® MATLAB® filter design tools, which may include the designfilt function.

For the signal power analysis, an input signal sample time interval, dt, may be selected to provide the sampling frequency, Fs=1/dt. The signal length sig_len may be determined from the length of the signal in samples. The sample time interval may be varied by the skilled artisan based on preference and the bit rate of the signal as will be discussed further herein.

Depending upon the particular application, it may be desirable to provide an input signal software bandpass filter, INbf, to remove frequencies outside of the passband. The bandpass filter may be implemented using various techniques as known to those of skill in the art, such as described above.

In operation, an input signal, SIGin having power distributed over a signal frequency range is received. The input signal, SIGin, may be stored or buffered or otherwise processed to facilitate the calculation. The input signal software bandpass filter, INbf, may be applied to the input signal, SIGin to produce a filtered input signal, SIGin_filtered, which may be normalized to produce a normalized signal power, SIGin_norm, which may be stored for use in various calculations.

For each frequency bin, a mixing frequency, f_mix, appropriate for translating from a source frequency, f_source associated with the frequency bin to the target IF frequency, f_target, by mixing (i.e., by pairwise multiplication of samples of two streams), may be determined employing the equation:

$$2*\cos(a)*\cos(b)=\cos(a-b)+\cos(a+b)$$

and defining $a=f\_source$ and $b=f\_mix$, where $$f\_mix=f\_source-f\_target.$$

A mixing stream or sequence, cos_mix, of length sig_len equal to the input signal length may then be calculated by evaluating the cosine function over the range from 0 to rads_per_signal in increments of rads_per_sample, which may be written as:

$$\cosmix=\{\cos(0),\cos(rads\_per\_sample),\cos(2*rads\_per\_sample),\cos(3*rads\_per\_sample), \ldots \cos(rads\_per\_signal)\}$$

where $$rads\_per\_sample=f\_mix*dt*2*pi, \text{ and}$$

$$rads\_per\_signal=rads\_per\_sample(sig\_len-1)$$

or in shorthand MATLAB notation as:

$$cos\_mix=\cos(0:rads\_per\_sample: rads\_per\_signal)$$

The mixing stream, cos_mix, calculation results in a sequence of length rads_per_sample. The above equation for cos_mix may be implemented by one of skill in the art using software, e.g., MATLAB®, which provide such functions, or via custom code.

An intermediate frequency (IF) signal, sig_IF, may be generated using the formula, $$sig\_IF=SIGin\_norm*cos\_mix.$$

If the input signal is not normalized, but filtered, then the filtered input signal, SIGin_filtered, may be used in the preceding equation. If the input signal is not filtered or normalized, then the input signal, SIGin, may be used in the preceding equation.

The corresponding bandpass filter, ifbpf, is applied to each intermediate frequency (IF) signal, sig_IF, to generate a filtered IF signal, sig_IF_filtered for each frequency bin. It will be appreciated that the intermediate frequency bandpass filter, ifbpf, may be the same for each frequency bin, some or none of the frequency bins.

A bin power, bin_power, in the filtered IF signal, sig_IF_filtered, may be calculated by summing the square of the amplitudes in sig_IF_filtered and dividing this sum by the time interval, and stored for each frequency bin.

The frequency bin having the maximum bin_power, max_power may be identified and used for various purposes. For example, the occupied bandwidth of the input signal may be calculated in various ways, such as by summing the frequency widths of frequency bins based on the bin power, bin_power, in each frequency bin proximate to the frequency bin with maximum power.

In various embodiments, the OBW may be calculated as a two-sided occupied bandwidth of the input signal by starting with the frequency width of the maximum power bin, then successively summing the frequency widths of the frequency bins with highest power adjacent on either side to the maximum power bin or to a previously summed frequency bin based until the sum of the power in the frequency power bins is equal to 99% or some desired percentage of the input signal power. The single-sided occupied bandwidth may be calculated by dividing the two-sided occupied bandwidth by two to provide an average or by summing the power in frequency bins spanning lower and higher frequencies, respectively, than the frequency bin with the maximum power.

The OBW may be calculated by successively summing power from the lowest frequency bin to the highest frequency bin and calculating the 99% OBW as the difference between the frequencies at which the 0.5% power and the 99.5% power is reached. This method may be used with the present invention. However, the method described above, which starts from the peak power frequency bin and successively expands to adjacent frequency power bins, may more accurately reflect the desire to define OBW as centered around the peak power. The two methods may be equivalent if the spectrum is symmetric around the peak power, but may diverge if for any reason the spectrum is not symmetric around the peak power.

Systems 10 and devices of the present invention include software and/or hardware to analyze signal power over a frequency range, which may be useful for OBW and other signal processing and control purposes. The signal analysis methods may be implemented at various points in the system 10 including the transmitters, receivers, and locations along a link as desired, for example, for feedback loops and link performance analyses. For example, the OBW or other PSD measurement may be used to vary various waveform or transmission characteristics to improve the transmission performance, such as decreasing the OBW of the signal, increasing the signal to noise ratio, BER vs. AWGN, etc. based on the spectral analysis.

One of ordinary skill will appreciate that software and hardware systems, devices, methods implementing the present invention may perform the spectrum analysis using the same input signal, SIGin, for each frequency bin calculation. However, it may be desirable in some applications to implement the present invention using multiple input signals from different points in time and/or different frequency spectra. In addition, the calculations may be performed in serially, in parallel, or combinations thereof.

The performance of the SSA of the present invention was compared to an HP 8590B hardware-based swept-tuned spectrum analyzer (HSTSA) for time amplitude sequences generated by the same Polynomial Symbol Waveform (PSW) alphabets that employ a time-varying signal spectrum. For more information on PSW alphabets, refer to U.S. Pat. No. 10,069,664 incorporated above, and U.S. patent application Ser. No. 16/735,655 filed Mar. 6, 2020 entitled "Devices, Systems, And Methods Employing Polynomial Symbol Waveforms", the contents of which is incorporated by reference in its entirety, except for the claims and any disclosure contrary to this disclosure. The comparison examines the impact of varying stream/signal length, number of frequency bins, and bandpass filter length.

Figure 3:
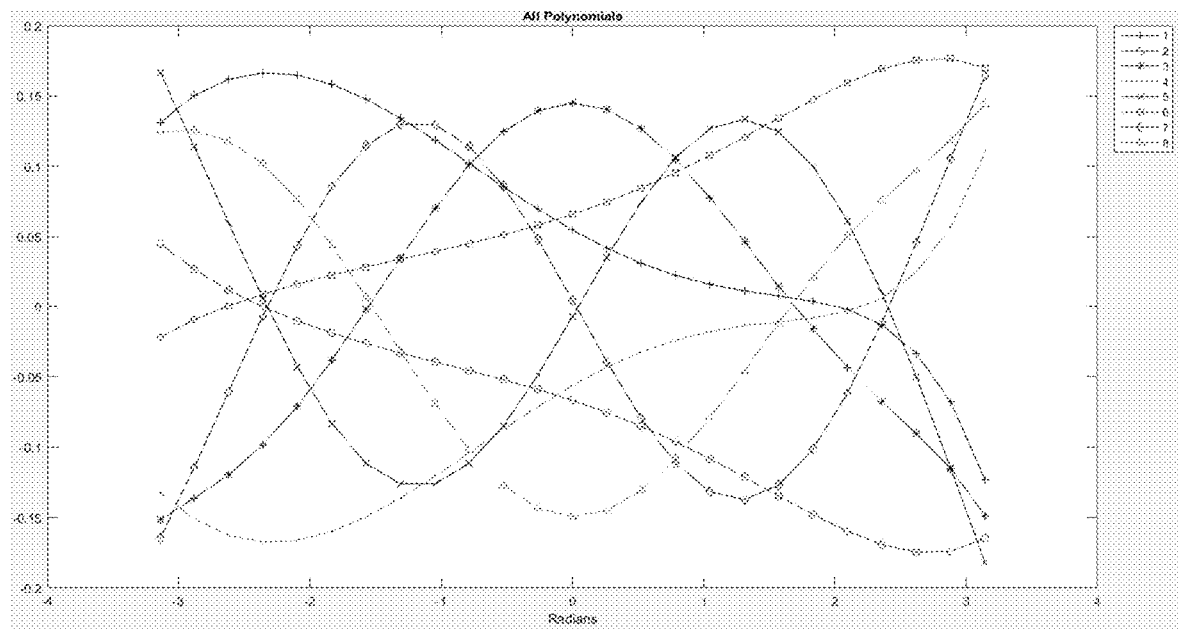
FIG. 3 illustrates an exemplary initial PSW alphabet.
Figure 4:
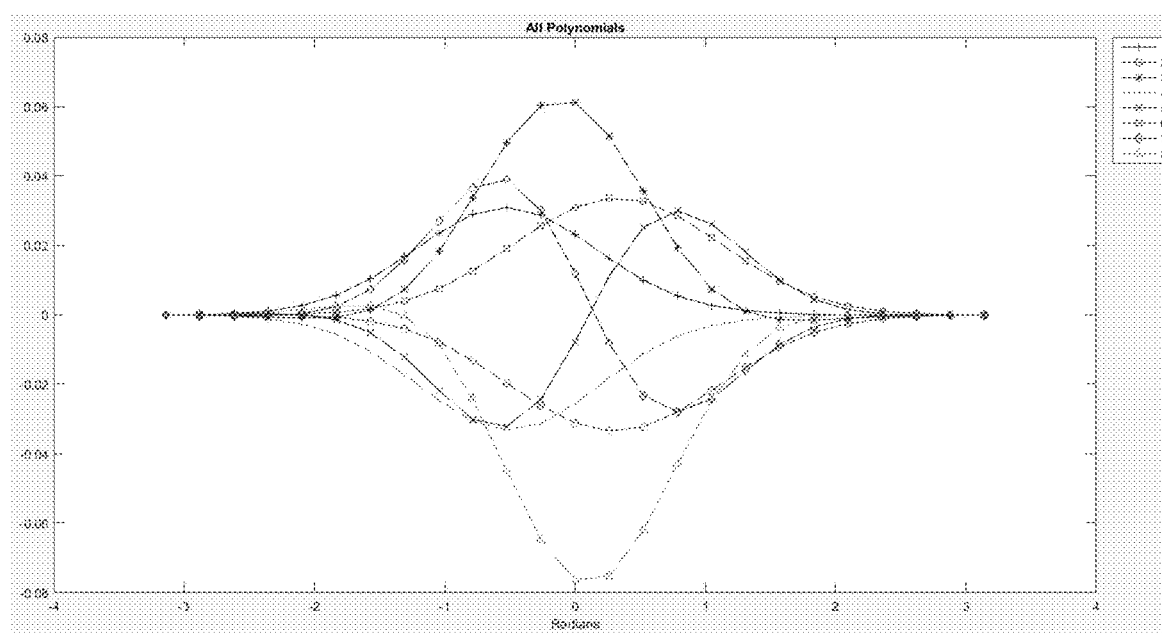
FIGS. 4-8 illustrates the exemplary initial PSW alphabet convolved with a polynomial corresponding to a Gaussian with mean zero and sigma values of 0.8, 1.0, 1.2, 1.6, and 2, respectively.
Figure 5:
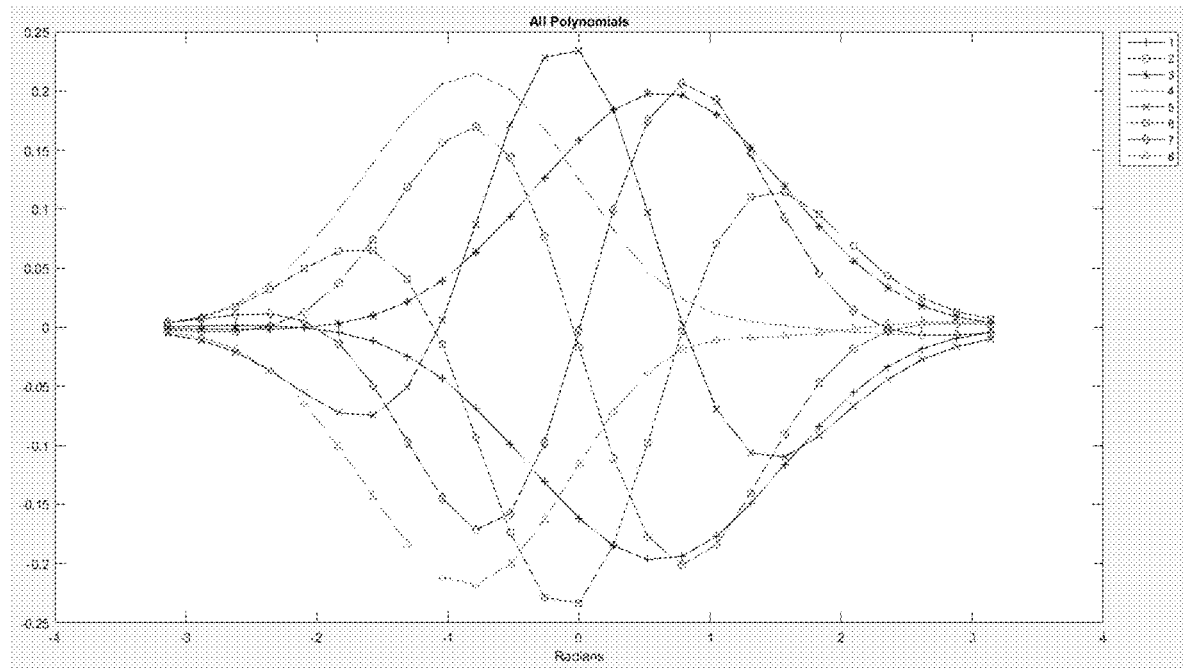
Figure 6:
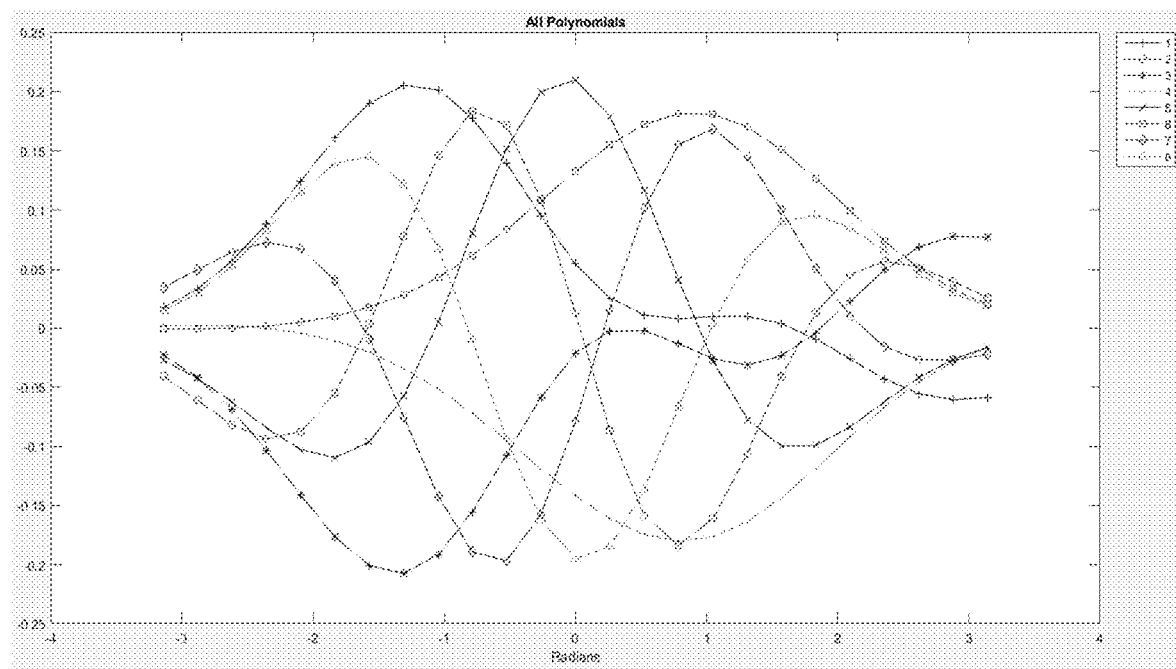
Figure 7:
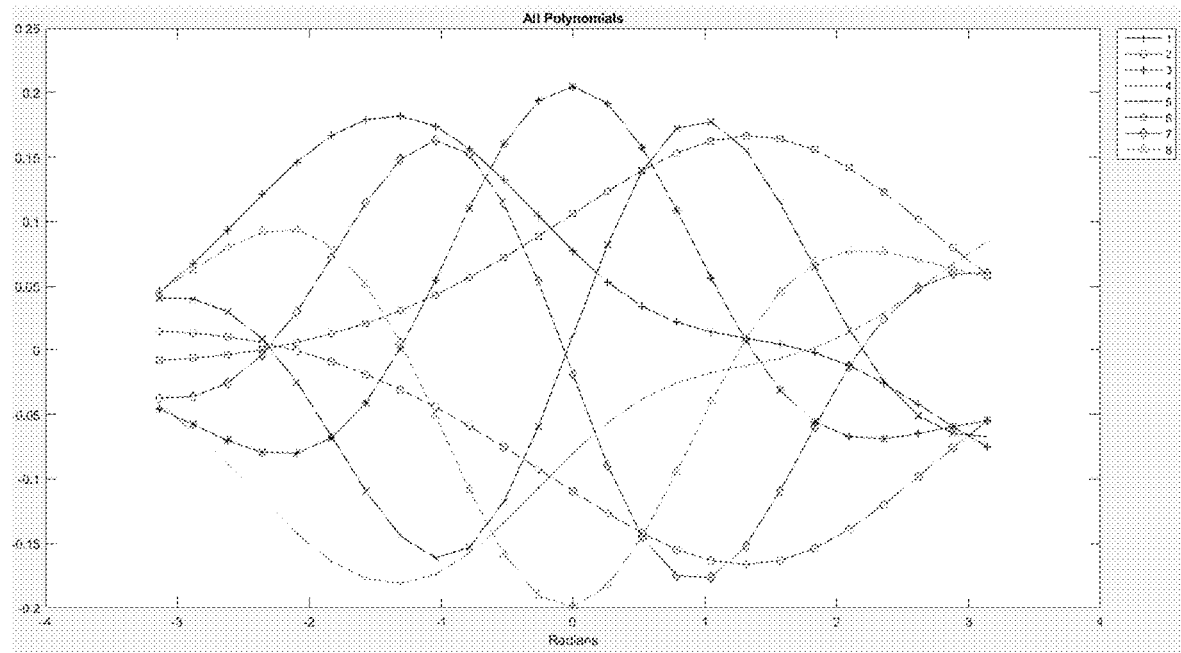
Figure 8:
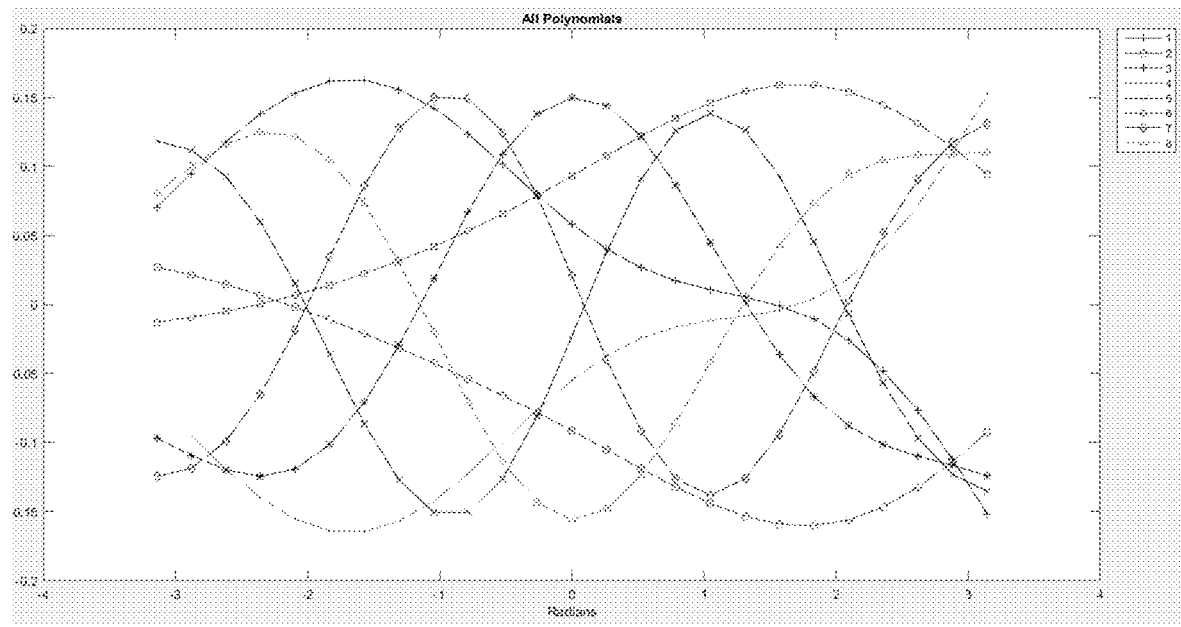

In the comparison, an initial set of 8 "polynomial symbol waveforms" (PSWs) were constructed as shown in FIG. 3, which may be collectively referred to as a PSW alphabet. To create PSW alphabets that would generate signals with different OBW properties, the initial PSW alphabet was convolved with a polynomial corresponding to a Gaussian with mean zero and sigma values of 0.8, 1.0, 1.2, 1.6, and 2, as shown in FIGS. 4-8, respectively. The initial PSW alphabet (which has very high OBW) was not tested, only the convolved PSW alphabets.

A three-bit sequence was assigned to each of the PSWs in each of the convolved PSW alphabets.

In the below discussion, "bit stream length" refers to the number of bits transmitted. The OBW measurements are based on analyzing time-amplitude sequences generated by converting a random sequence of bits into a corresponding random sequence of PSWs from a particular PSW alphabet. For purposes of this study, all PSW alphabets have 8 symbols, corresponding to bit sequences of length 3, and each polynomial symbol waveform is represented by 25 sample points.

For all analyses reported below, the following parameters apply:

Symbol time, dt=1 microseconds $f_c$=922 MHz, where $f_c$ is the center frequency of the signal $f_{min}=f_c-10$ MHz $f_{max}=f_c+10$ MHz 30 trials per condition The one-sided OBW is reported.

OBW is measured in terms of the 99% power spectral density (PSD) width. Two approaches to OBW measurement were performed, although a multiple of other approaches may be selected by the skilled artisan.

Method I: Adding frequency power bins. Find the range of frequency power bins containing 99% of the signal power. The results of which are shown in FIGS. 9-12.

Figure 13:
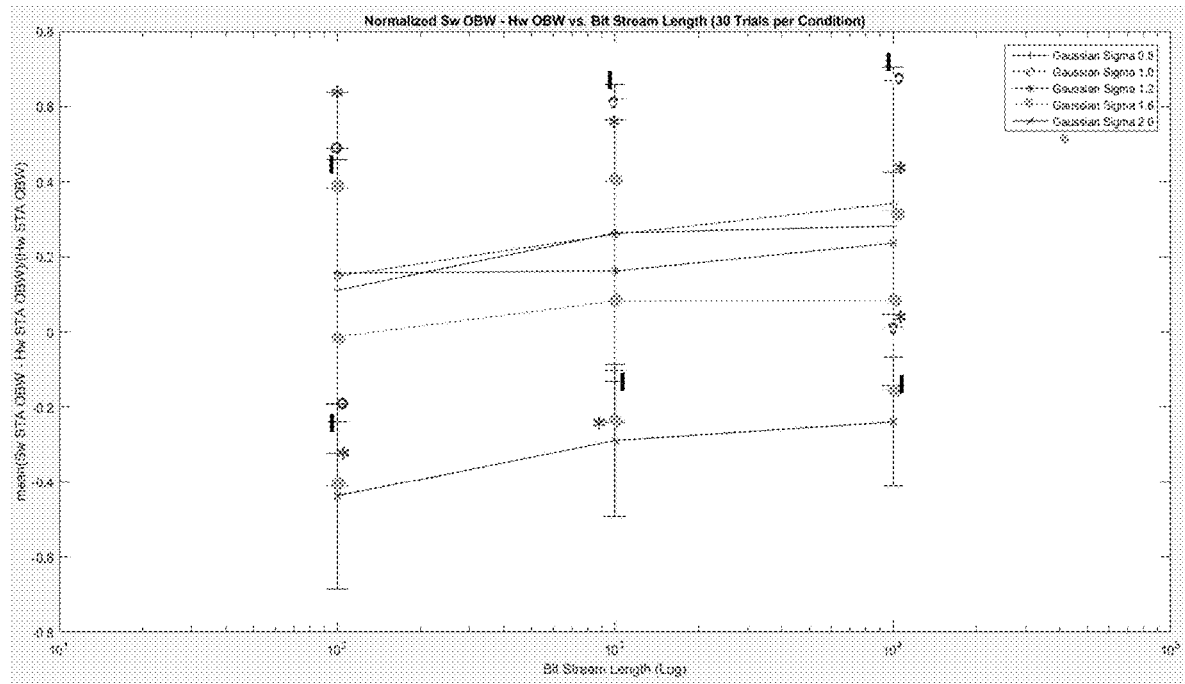
Figure 14:
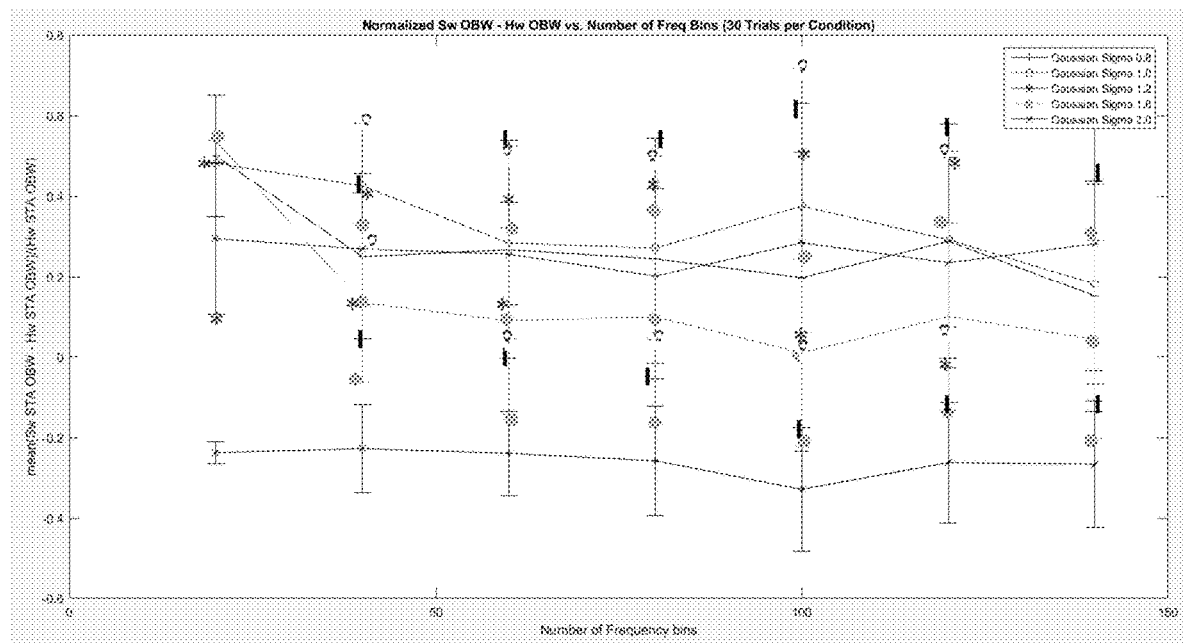
Figure 15:
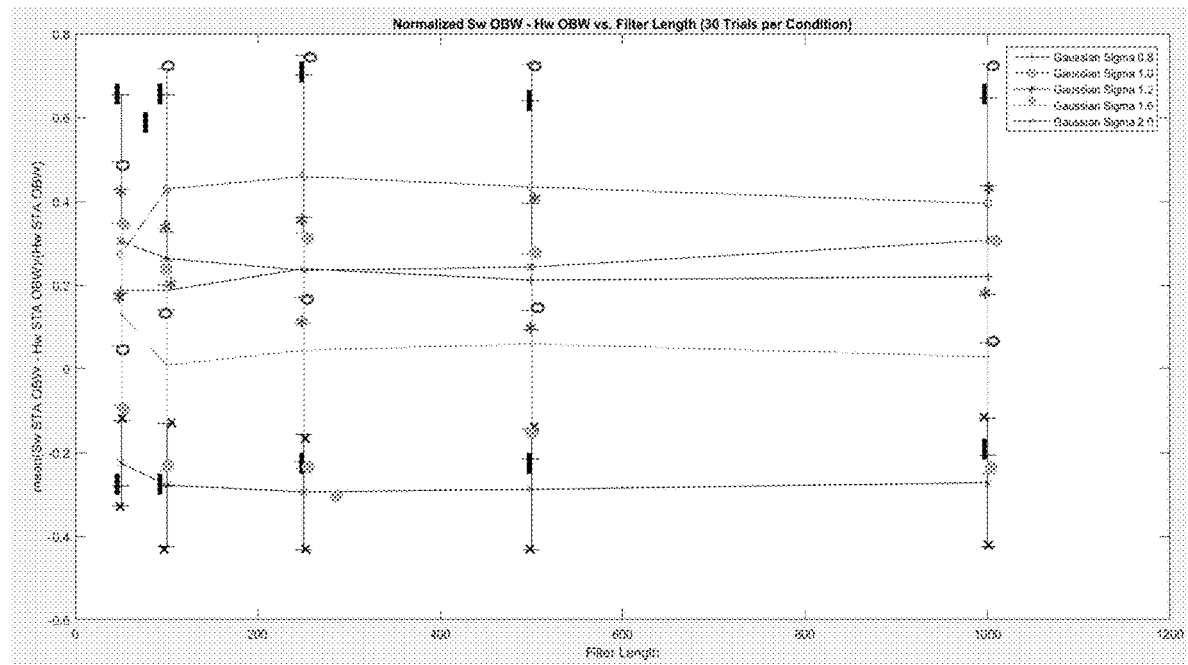

Method II: Find the frequency difference between the frequency bin of the maximum power point and the frequency bin of 1% signal power. The results of which are shown in FIGS. 13-15.

Method I generally produced better agreement with the HSTSA, and much better test/re-test consistency (lower standard deviation), as further described herein. The second approach produced reasonable results and may prove more appropriate for other applications.

The following data, derived from trials reported in more detail below, shows consistency between the SSA and the HSTSA to within less than 10%. A summary of the comparison is provided in Table 1 below.

TABLE 1

METHOD I: SSA AND HSTSA OBW COMPARISON

| PSW Alphabet | SSA OBW (MHz) | HSTSA OBW (MHz) |
|---|---|---|
| Gaussian σ = 0.8 | 3.4 | 3.2 |
| Gaussian σ = 1.0 | 2.9 | 2.7 |
| Gaussian σ = 1.2 | 2.7 | 2.6 |
| Gaussian σ = 1.6 | 2.5 | 2.6 |
| Gaussian σ = 2.0 | 6.0 | 6.6 |

This data shows consistency between the SSA and the HSTSA to within less than 10%.

Effect of Bit Stream Length on OBW Measurement

Figure 9:
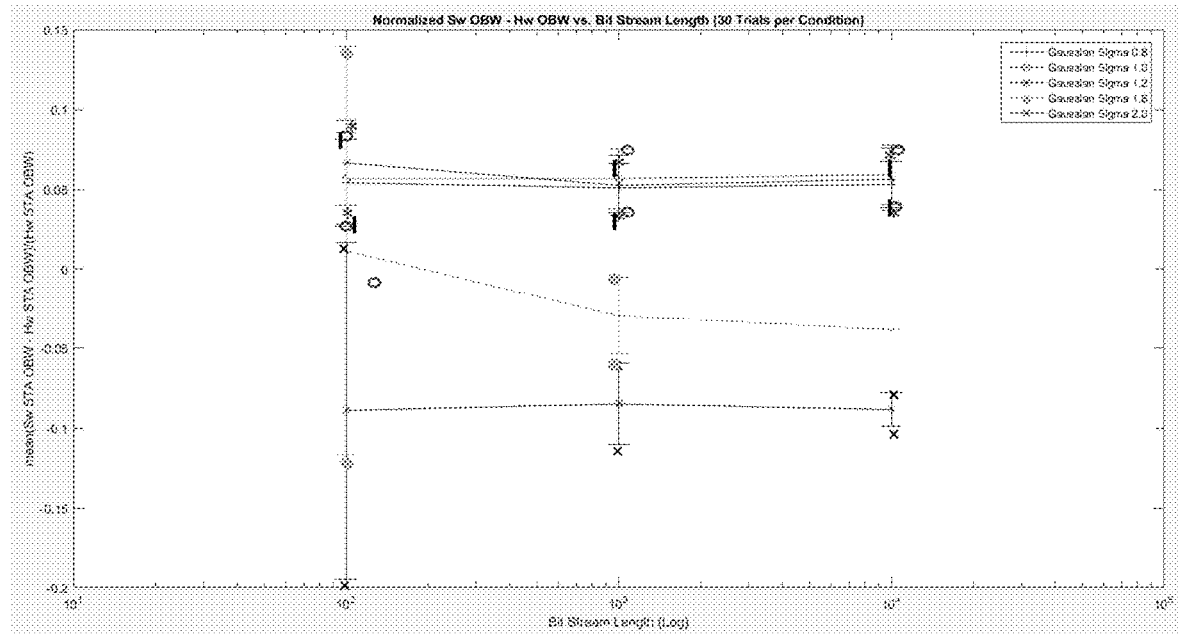
FIGS. 9-15 show the normalized difference between the SSA and HSTSA OBW calculation as a function of bit stream length, number of frequency bins, and IF filter length using two methods of calculating the OBW based on the calculated power in the frequency bins.

FIG. 9 shows several comparisons were made to examine the question of how the SSA performance is affected by the length (in bits) of the input stream (100, 1,000, 10,000). The SSA IF filter is of length 500 for the trials reported below. The number of frequency bins is 100.

The data used in FIG. 9 for the above figure are given below.

PSW=Gaussian Sigma 0.8, bit stream len=100, Normalized OBW Diff=0.054167(0.027136), HSTSA OBW=3.2e+06

PSW=Gaussian Sigma 0.8, bit stream len=1000, Normalized OBW Diff=0.051042(0.015317), HSTSA OBW=3.2e+06

PSW=Gaussian Sigma 0.8, bit stream len=10000, Normalized OBW Diff=0.053125(0.014565), HSTSA OBW=3.2e+06

PSW=Gaussian Sigma 1.0, bit stream len=100, Normalized OBW Diff=0.05679(0.028744), HSTSA OBW=2.7e+06

PSW=Gaussian Sigma 1.0, bit stream len=1000, Normalized OBW Diff=0.05679(0.018793), HSTSA OBW=2.7e+06

PSW=Gaussian Sigma 1.0, bit stream len=10000, Normalized OBW Diff=0.059259(0.018455), HSTSA OBW=2.7e+06

PSW=Gaussian Sigma 1.2, bit stream len=100, Normalized OBW Diff=0.066667(0.026596), HSTSA OBW=2.6e+06

PSW=Gaussian Sigma 1.2, bit stream len=1000, Normalized OBW Diff=0.052564(0.018851), HSTSA OBW=2.6e+06

PSW=Gaussian Sigma 1.2, bit stream len=10000, Normalized OBW Diff=0.05641(0.019516), HSTSA OBW=2.6e+06

PSW=Gaussian Sigma 1.6, bit stream len=100, Normalized OBW Diff=0.011538(0.12822), HSTSA OBW=2.6e+06

PSW=Gaussian Sigma 1.6, bit stream len=1000, Normalized OBW Diff=−0.029487(0.024079), HSTSA OBW=2.6e+06

PSW=Gaussian Sigma 1.6, bit stream len=10000, Normalized OBW Diff=−0.038462(0), HSTSA OBW=2.6e+06

PSW=Gaussian Sigma 2.0, bit stream len=100, Normalized OBW Diff=−0.088889(0.1057), HSTSA OBW=6.6e+06

PSW=Gaussian Sigma 2.0, bit stream len=1000, Normalized OBW Diff=−0.084848(0.025353), HSTSA OBW=6.6e+06

PSW=Gaussian Sigma 2.0, bit stream len=10000, Normalized OBW Diff=−0.088384(0.01059), HSTSA OBW=6.6e+06

The (logarithmic) x-axis provides the number of bits transmitted. In FIGS. 9-15, the y-axis provides the mean normalized difference between the SSA and the HSTSA OBW for matched conditions with the standard deviation over 30 trials per condition provided in parentheses. The HSTSA value is provided as the last number of each line. The standard deviations are indicated by the error bars.

Note that while the SSA OBW results are provided for between 100 and 10,000 simulated transmitted bits, the comparison is against HSTSA OBW based on 1.5 million bits transmitted.

These data show that the mean SSA OBW measurement agrees with the HSTSA to within less than 10% for 100 or more simulated bits transmitted. The standard deviation in the difference between the SSA and HSTSA measurements decreases with more bits transmitted.

In operation, the SSA may store some or the entire input sequence and analyze it repeatedly for different frequency bins, whereas the HSTSA analyzes different parts of the input signal for each frequency bin. This allows the SSA to be more compact than the HSTSA in terms of required input sequence length.

Figure 10:
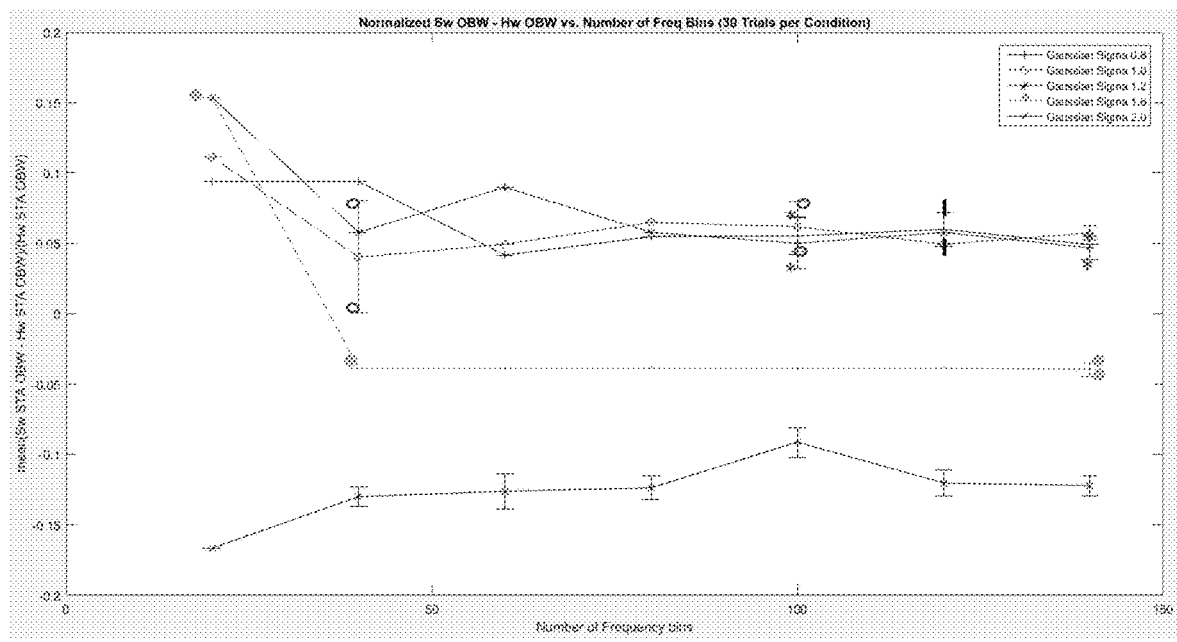

FIG. 10 show a comparison of the SSA performance as affected by the number of frequency bins (20, 40, 60, 80, 100, 120, 140). The number of bits transmitted is 10,000 and the SSA IF filter length is 500. The x-axis provides the number of frequency bins. The y-axis provides the mean normalized difference between the SSA and the HSTSA OBW for matched conditions. The standard deviations are indicated by the error bars based on the following data.

PSW=Gaussian Sigma 0.8, f_num=20, Normalized OBW Diff=0.09375(0), HSTSA OBW=3.2e+06

PSW=Gaussian Sigma 0.8, f_num=40, Normalized OBW Diff=0.09375(0), HSTSA OBW=3.2e+06

PSW=Gaussian Sigma 0.8, f_num=60, Normalized OBW Diff=0.041667(0), HSTSA OBW=3.2e+06

PSW=Gaussian Sigma 0.8, f_num=80, Normalized OBW Diff=0.054688(0), HSTSA OBW=3.2e+06

PSW=Gaussian Sigma 0.8, f_num=100, Normalized OBW Diff=0.055208(0.013443), HSTSA OBW=3.2e+06

PSW=Gaussian Sigma 0.8, f_num=120, Normalized OBW Diff=0.059896(0.012138), HSTSA OBW=3.2e+06

PSW=Gaussian Sigma 0.8, f_num=140, Normalized OBW Diff=0.049107(0), HSTSA OBW=3.2e+06

PSW=Gaussian Sigma 1.0, f_num=20, Normalized OBW Diff=0.11111(0), HSTSA OBW=2.7e+06

PSW=Gaussian Sigma 1.0, f_num=40, Normalized OBW Diff=0.040123(0.039832), HSTSA OBW=2.7e+06

PSW=Gaussian Sigma 1.0, f_num=60, Normalized OBW Diff=0.049383(0), HSTSA OBW=2.7e+06

PSW=Gaussian Sigma 1.0, f_num=80, Normalized OBW Diff=0.064815(0), HSTSA OBW=2.7e+06

PSW=Gaussian Sigma 1.0, f_num=100, Normalized OBW Diff=0.061728(0.017758), HSTSA OBW=2.7e+06

PSW=Gaussian Sigma 1.0, f_num=120, Normalized OBW Diff=0.049383(0), HSTSA OBW=2.7e+06

PSW=Gaussian Sigma 1.0, f_num=140, Normalized OBW Diff=0.057319(0.00483), HSTSA OBW=2.7e+06

PSW=Gaussian Sigma 1.2, f_num=20, Normalized OBW Diff=0.15385(0), HSTSA OBW=2.6e+06

PSW=Gaussian Sigma 1.2, f_num=40, Normalized OBW Diff=0.057692(0), HSTSA OBW=2.6e+06

PSW=Gaussian Sigma 1.2, f_num=60, Normalized OBW Diff=0.089744(0), HSTSA OBW=2.6e+06

PSW=Gaussian Sigma 1.2, f_num=80, Normalized OBW Diff=0.057692(0), HSTSA OBW=2.6e+06

PSW=Gaussian Sigma 1.2, f_num=100, Normalized OBW Diff=0.05(0.017927), HSTSA OBW=2.6e+06

PSW=Gaussian Sigma 1.2, f_num=120, Normalized OBW Diff=0.057692(0), HSTSA OBW=2.6e+06

PSW=Gaussian Sigma 1.2, f_num=140, Normalized OBW Diff=0.046703(0.0083827), HSTSA OBW=2.6e+06

PSW=Gaussian Sigma 1.6, f_num=20, Normalized OBW Diff=0.15385(0), HSTSA OBW=2.6e+06

PSW=Gaussian Sigma 1.6, f_num=40, Normalized OBW Diff=−0.038462(0), HSTSA OBW=2.6e+06

PSW=Gaussian Sigma 1.6, f_num=60, Normalized OBW Diff=−0.038462(0), HSTSA OBW=2.6e+06

PSW=Gaussian Sigma 1.6, f_num=80, Normalized OBW Diff=−0.038462(0), HSTSA OBW=2.6e+06

PSW=Gaussian Sigma 1.6, f_num=100, Normalized OBW Diff=−0.038462(0), HSTSA OBW=2.6e+06

PSW=Gaussian Sigma 1.6, f_num=120, Normalized OBW Diff=−0.038462(0), HSTSA OBW=2.6e+06

PSW=Gaussian Sigma 1.6, f_num=140, Normalized OBW Diff=−0.039377(0.0050158), HSTSA OBW=2.6e+06

PSW=Gaussian Sigma 2.0, f_num=20, Normalized OBW Diff=−0.16667(0), HSTSA OBW=6.6e+06

PSW=Gaussian Sigma 2.0, f_num=40, Normalized OBW Diff=−0.13005(0.0069157), HSTSA OBW=6.6e+06

PSW=Gaussian Sigma 2.0, f_num=60, Normalized OBW Diff=−0.12626(0.012583), HSTSA OBW=6.6e+06

PSW=Gaussian Sigma 2.0, f_num=80, Normalized OBW Diff=−0.12374(0.0085185), HSTSA OBW=6.6e+06

PSW=Gaussian Sigma 2.0, f_num=100, Normalized OBW Diff=−0.091414(0.010885), HSTSA OBW=6.6e+06

PSW=Gaussian Sigma 2.0, f_num=120, Normalized OBW Diff=−0.12037(0.0089793), HSTSA OBW=6.6e+06

PSW=Gaussian Sigma 2.0, f_num=140, Normalized OBW Diff=−0.12229(0.0071619), HSTSA OBW=6.6e+06

Figure 11:
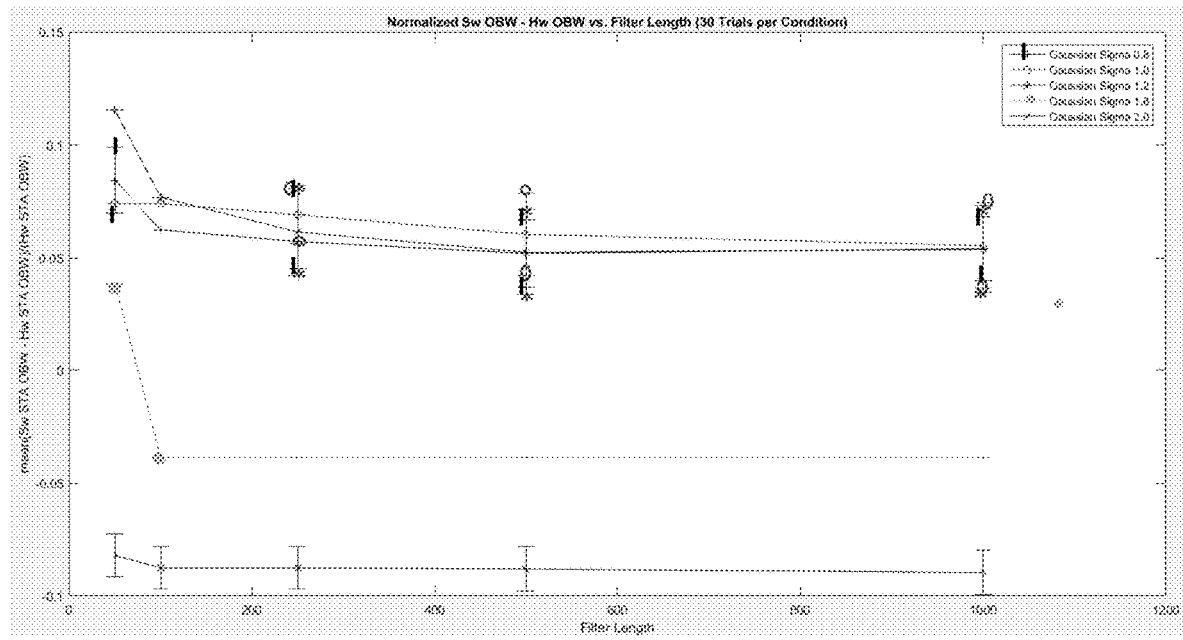

FIG. 11 show a comparison between the SSA and the HSTSA as a function of the length of the SSA IF filter (50, 100, 250, 500, 1000). The bit stream length is 10,000 for the trials reported below. The number of frequency bins is 100. The x-axis provides the SSA IF filter length. The y-axis provides the mean normalized difference between the SSA and the HSTSA OBW for matched conditions. The standard deviations are indicated by the error bars.

The data used to generate FIG. 11 is as follows:

PSW=Gaussian Sigma 0.8, filter len=50, Normalized OBW Diff=0.084375(0.014565), HSTSA OBW=3.2e+06

PSW=Gaussian Sigma 0.8, filter len=100, Normalized OBW Diff=0.0625(0), HSTSA OBW=3.2e+06

PSW=Gaussian Sigma 0.8, filter len=250, Normalized OBW Diff=0.057292(0.011845), HSTSA OBW=3.2e+06

PSW=Gaussian Sigma 0.8, filter len=500, Normalized OBW Diff=0.052083(0.014983), HSTSA OBW=3.2e+06

PSW=Gaussian Sigma 0.8, filter len=1000, Normalized OBW Diff=0.054167(0.014056), HSTSA OBW=3.2e+06

PSW=Gaussian Sigma 1.0, filter len=50, Normalized OBW Diff=0.074074(0), HSTSA OBW=2.7e+06

PSW=Gaussian Sigma 1.0, filter len=100, Normalized OBW Diff=0.074074(0), HSTSA OBW=2.7e+06

PSW=Gaussian Sigma 1.0, filter len=250, Normalized OBW Diff=0.069136(0.012805), HSTSA OBW=2.7e+06

PSW=Gaussian Sigma 1.0, filter len=500, Normalized OBW Diff=0.060494(0.018153), HSTSA OBW=2.7e+06

PSW=Gaussian Sigma 1.0, filter len=1000, Normalized OBW Diff=0.055556(0.018835), HSTSA OBW=2.7e+06

PSW=Gaussian Sigma 1.2, filter len=50, Normalized OBW Diff=0.11538(0), HSTSA OBW=2.6e+06

PSW=Gaussian Sigma 1.2, filter len=100, Normalized OBW Diff=0.076923(0), HSTSA OBW=2.6e+06

PSW=Gaussian Sigma 1.2, filter len=250, Normalized OBW Diff=0.061538(0.019164), HSTSA OBW=2.6e+06

PSW=Gaussian Sigma 1.2, filter len=500, Normalized OBW Diff=0.052564(0.018851), HSTSA OBW=2.6e+06

PSW=Gaussian Sigma 1.2, filter len=1000, Normalized OBW Diff=0.053846(0.019164), HSTSA OBW=2.6e+06

PSW=Gaussian Sigma 1.6, filter len=50, Normalized OBW Diff=0.038462(0), HSTSA OBW=2.6e+06

PSW=Gaussian Sigma 1.6, filter len=100, Normalized OBW Diff=−0.038462(0), HSTSA OBW=2.6e+06

PSW=Gaussian Sigma 1.6, filter len=250, Normalized OBW Diff=−0.038462(0), HSTSA OBW=2.6e+06

PSW=Gaussian Sigma 1.6, filter len=500, Normalized OBW Diff=−0.038462(0), HSTSA OBW=2.6e+06

PSW=Gaussian Sigma 1.6, filter len=1000, Normalized OBW Diff=−0.038462(0), HSTSA OBW=2.6e+06

PSW=Gaussian Sigma 2.0, filter len=50, Normalized OBW Diff=−0.081818(0.009416), HSTSA OBW=6.6e+06

PSW=Gaussian Sigma 2.0, filter len=100, Normalized OBW Diff=−0.087374(0.0094858), HSTSA OBW=6.6e+06

PSW=Gaussian Sigma 2.0, filter len=250, Normalized OBW Diff=−0.087374(0.0094858), HSTSA OBW=6.6e+06

PSW=Gaussian Sigma 2.0, filter len=500, Normalized OBW Diff=−0.087879(0.010066), HSTSA OBW=6.6e+06

PSW=Gaussian Sigma 2.0, filter len=1000, Normalized OBW Diff=−0.089394(0.010027), HSTSA OBW=6.6e+06

For purposes of efficient run-time, particularly when used as part of PSW alphabet design, an important question is how light-weight can the SSA parameters be, while maintaining performance. Based on the data used in FIGS. 9-11, the following parameters were selected to allow for efficient execution:

Bits transmitted: 10,000
Number of frequency bins: 100
IF filter length: 100

Figure 12:
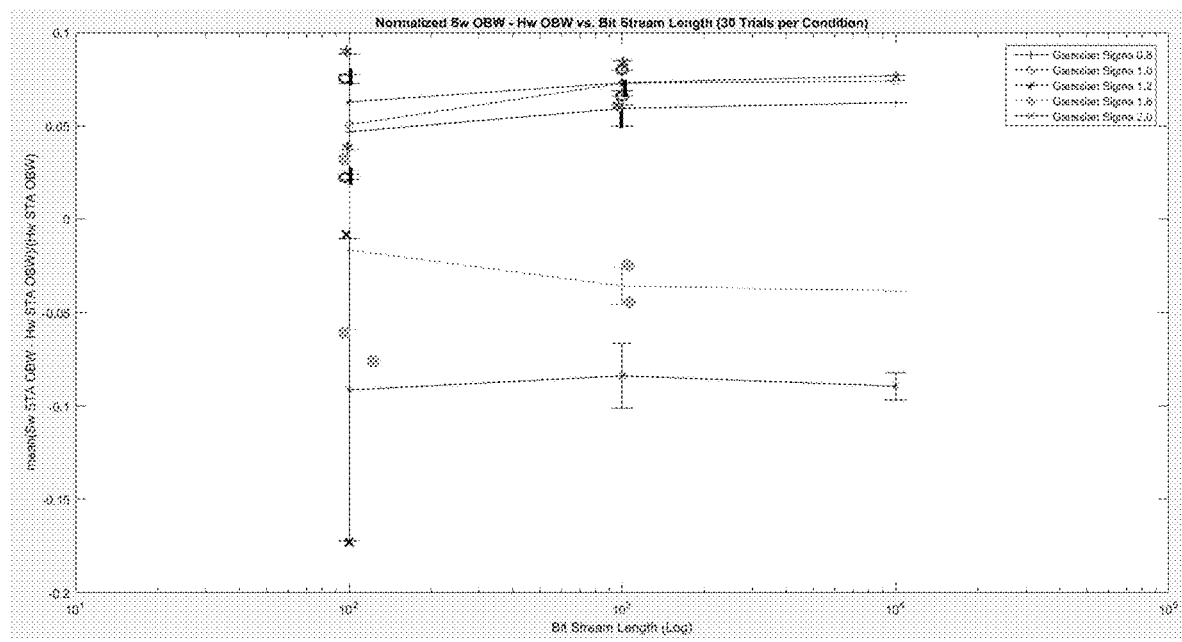

FIG. 12 shows the variation as a function of the number of bits transmitted as 100, 1,000, and 10,000.

FIGS. 13-15 show comparison analogous to the comparisons shown in FIGS. 9-11, but using Method II of calculating the OBW instead of Method I. A summary of the comparison is provided in Table 2 below.

TABLE 2

METHOD II: SSA AND HSTSA OBW COMPARISON

| PSW Alphabet | SSA OBW (MHz) | HSTSA OBW (MHz) |
|---|---|---|
| Gaussian σ = 0.8 | 3.6 | 3.2 |
| Gaussian σ = 1.0 | 3.0 | 2.7 |
| Gaussian σ = 1.2 | 3.0 | 2.6 |
| Gaussian σ = 1.6 | 2.0 | 2.6 |
| Gaussian σ = 2.0 | 5.0 | 6.6 |

For the Method II comparison, the number of bits transmitted was 1.5 million for both the SSA and the HSTSA. The data shows consistency between the SSA and the HSTSA to within about 20%, which is worse than for Method I as documented above. Also, Method II calculation has a standard deviation across trials that is much higher. These results may suggest that for these alphabets, Method I may be preferred based on the HSTSA comparison or the time averaging of the HSTSA does not adequately capture the spectrum, or some combination thereof.

FIG. 13 shows the Method II SSA performance as a function of the length (in bits) of the input stream. The SSA IF filter length is 500 and the number of frequency bins is 100, which yielded the following data with the standard deviation over 30 trials per condition provided in parentheses. The HSTSA value is provided as the last number of each line.

PSW=Gaussian Sigma 0.8, bit stream len=100, Normalized OBW Diff=0.11042(0.34922), HSTSA OBW=3.2e+06

PSW=Gaussian Sigma 0.8, bit stream len=1000, Normalized OBW Diff=0.2625(0.39542), HSTSA OBW=3.2e+06

PSW=Gaussian Sigma 0.8, bit stream len=10000, Normalized OBW Diff=0.28125(0.4235), HSTSA OBW=3.2e+06

PSW=Gaussian Sigma 1.0, bit stream len=100, Normalized OBW Diff=0.14815(0.34015), HSTSA OBW=2.7e+06

PSW=Gaussian Sigma 1.0, bit stream len=1000, Normalized OBW Diff=0.25926(0.36132), HSTSA OBW=2.7e+06

PSW=Gaussian Sigma 1.0, bit stream len=10000, Normalized OBW Diff=0.34074(0.32918), HSTSA OBW=2.7e+06

PSW=Gaussian Sigma 1.2, bit stream len=100, Normalized OBW Diff=0.15641(0.48038), HSTSA OBW=2.6e+06

PSW=Gaussian Sigma 1.2, bit stream len=1000, Normalized OBW Diff=0.16154(0.40166), HSTSA OBW=2.6e+06

PSW=Gaussian Sigma 1.2, bit stream len=10000, Normalized OBW Diff=0.2359(0.1905), HSTSA OBW=2.6e+06

PSW=Gaussian Sigma 1.6, bit stream len=100, Normalized OBW Diff=−0.012821(0.39744), HSTSA OBW=2.6e+06

PSW=Gaussian Sigma 1.6, bit stream len=1000, Normalized OBW Diff=0.082051(0.31744), HSTSA OBW=2.6e+06

PSW=Gaussian Sigma 1.6, bit stream len=10000, Normalized OBW Diff=0.084615(0.23761), HSTSA OBW=2.6e+06

PSW=Gaussian Sigma 2.0, bit stream len=100, Normalized OBW Diff=−0.43737(0.24743), HSTSA OBW=6.6e+06

PSW=Gaussian Sigma 2.0, bit stream len=1000, Normalized OBW Diff=−0.28889(0.20394), HSTSA OBW=6.6e+06

PSW=Gaussian Sigma 2.0, bit stream len=10000, Normalized OBW Diff=−0.23939(0.17167), HSTSA OBW=6.6e+06

FIG. 14 shows the Method II SSA performance as a function of the number of frequency bins (20, 40, 60, 80, 100, 120, 140). The number of bits transmitted is 10000 and the SSA IF filter is of length 500. The x-axis provides the number of frequency bins. The y-axis provides the mean normalized difference between the SSA and the HSTSA OBW for matched conditions. The standard deviations are indicated by the error bars for the following data.

PSW=Gaussian Sigma 0.8, f_num=20, Normalized OBW Diff=0.5(0.15132), HSTSA OBW=3.2e+06

PSW=Gaussian Sigma 0.8, f_num=40, Normalized OBW Diff=0.25(0.20517), HSTSA OBW=3.2e+06

PSW=Gaussian Sigma 0.8, f_num=60, Normalized OBW Diff=0.26736(0.27092), HSTSA OBW=3.2e+06

PSW=Gaussian Sigma 0.8, f_num=80, Normalized OBW Diff=0.24479(0.29868), HSTSA OBW=3.2e+06

PSW=Gaussian Sigma 0.8, f_num=100, Normalized OBW Diff=0.19792(0.4321), HSTSA OBW=3.2e+06

PSW=Gaussian Sigma 0.8, f_num=120, Normalized OBW Diff=0.28819(0.29077), HSTSA OBW=3.2e+06

PSW=Gaussian Sigma 0.8, f_num=140, Normalized OBW Diff=0.15179(0.28583), HSTSA OBW=3.2e+06

PSW=Gaussian Sigma 1.0, f_num=20, Normalized OBW Diff=0.48148(0), HSTSA OBW=2.7e+06

PSW=Gaussian Sigma 1.0, f_num=40, Normalized OBW Diff=0.42593(0.15494), HSTSA OBW=2.7e+06

PSW=Gaussian Sigma 1.0, f_num=60, Normalized OBW Diff=0.28395(0.23957), HSTSA OBW=2.7e+06

PSW=Gaussian Sigma 1.0, f_num=80, Normalized OBW Diff=0.2716(0.22802), HSTSA OBW=2.7e+06

PSW=Gaussian Sigma 1.0, f_num=100, Normalized OBW Diff=0.37531(0.34288), HSTSA OBW=2.7e+06

PSW=Gaussian Sigma 1.0, f_num=120, Normalized OBW Diff=0.29218(0.21865), HSTSA OBW=2.7e+06

PSW=Gaussian Sigma 1.0, f_num=140, Normalized OBW Diff=0.18166(0.24946), HSTSA OBW=2.7e+06

PSW=Gaussian Sigma 1.2, f_num=20, Normalized OBW Diff=0.29487(0.18851), HSTSA OBW=2.6e+06

PSW=Gaussian Sigma 1.2, f_num=40, Normalized OBW Diff=0.26923(0.13923), HSTSA OBW=2.6e+06

PSW=Gaussian Sigma 1.2, f_num=60, Normalized OBW Diff=0.25641(0.12776), HSTSA OBW=2.6e+06

PSW=Gaussian Sigma 1.2, f_num=80, Normalized OBW Diff=0.20192(0.21685), HSTSA OBW=2.6e+06

PSW=Gaussian Sigma 1.2, f_num=100, Normalized OBW Diff=0.28462(0.22418), HSTSA OBW=2.6e+06

PSW=Gaussian Sigma 1.2, f_num=120, Normalized OBW Diff=0.23504(0.2613), HSTSA OBW=2.6e+06

PSW=Gaussian Sigma 1.2, f_num=140, Normalized OBW Diff=0.28205(0.31525), HSTSA OBW=2.6e+06

PSW=Gaussian Sigma 1.6, f_num=20, Normalized OBW Diff=0.53846(0), HSTSA OBW=2.6e+06

PSW=Gaussian Sigma 1.6, f_num=40, Normalized OBW Diff=0.13462(0.19786), HSTSA OBW=2.6e+06

PSW=Gaussian Sigma 1.6, f_num=60, Normalized OBW Diff=0.089744(0.23265), HSTSA OBW=2.6e+06

PSW=Gaussian Sigma 1.6, f_num=80, Normalized OBW Diff=0.099359(0.26325), HSTSA OBW=2.6e+06

PSW=Gaussian Sigma 1.6, f_num=100, Normalized OBW Diff=0.010256(0.23361), HSTSA OBW=2.6e+06

PSW=Gaussian Sigma 1.6, f_num=120, Normalized OBW Diff=0.10043(0.23331), HSTSA OBW=2.6e+06

PSW=Gaussian Sigma 1.6, f_num=140, Normalized OBW Diff=0.043956(0.24741), HSTSA OBW=2.6e+06

PSW=Gaussian Sigma 2.0, f_num=20, Normalized OBW Diff=−0.23737(0.027663), HSTSA OBW=6.6e+06

PSW=Gaussian Sigma 2.0, f_num=40, Normalized OBW Diff=−0.22727(0.10969), HSTSA OBW=6.6e+06

PSW=Gaussian Sigma 2.0, f_num=60, Normalized OBW Diff=−0.23906(0.10438), HSTSA OBW=6.6e+06

PSW=Gaussian Sigma 2.0, f_num=80, Normalized OBW Diff=−0.25758(0.13552), HSTSA OBW=6.6e+06

PSW=Gaussian Sigma 2.0, f_num=100, Normalized OBW Diff=−0.32828(0.15268), HSTSA OBW=6.6e+06

PSW=Gaussian Sigma 2.0, f_num=120, Normalized OBW Diff=−0.26178(0.14972), HSTSA OBW=6.6e+06

PSW=Gaussian Sigma 2.0, f_num=140, Normalized OBW Diff=−0.26623(0.15725), HSTSA OBW=6.6e+06

FIG. 15 shows the Method II SSA performance as a function of the length of the SSA IF filter (50, 100, 250, 500, 1000). The bit stream length is 10000 for the trials reported below. The number of frequency bins is 100.

PSW=Gaussian Sigma 0.8, filter len=50, Normalized OBW Diff=0.1875(0.46713), HSTSA OBW=3.2e+06

PSW=Gaussian Sigma 0.8, filter len=100, Normalized OBW Diff=0.1875(0.46713), HSTSA OBW=3.2e+06

PSW=Gaussian Sigma 0.8, filter len=250, Normalized OBW Diff=0.23958(0.4631), HSTSA OBW=3.2e+06

PSW=Gaussian Sigma 0.8, filter len=500, Normalized OBW Diff=0.2125(0.42757), HSTSA OBW=3.2e+06

PSW=Gaussian Sigma 0.8, filter len=1000, Normalized OBW Diff=0.22083(0.42666), HSTSA OBW=3.2e+06

PSW=Gaussian Sigma 1.0, filter len=50, Normalized OBW Diff=0.27407(0.22043), HSTSA OBW=2.7e+06

PSW=Gaussian Sigma 1.0, filter len=100, Normalized OBW Diff=0.42963(0.28732), HSTSA OBW=2.7e+06

PSW=Gaussian Sigma 1.0, filter len=250, Normalized OBW Diff=0.45926(0.28797), HSTSA OBW=2.7e+06

PSW=Gaussian Sigma 1.0, filter len=500, Normalized OBW Diff=0.43457(0.2934), HSTSA OBW=2.7e+06

PSW=Gaussian Sigma 1.0, filter len=1000, Normalized OBW Diff=0.39506(0.33303), HSTSA OBW=2.7e+06

PSW=Gaussian Sigma 1.2, filter len=50, Normalized OBW Diff=0.30513(0.12368), HSTSA OBW=2.6e+06

PSW=Gaussian Sigma 1.2, filter len=100, Normalized OBW Diff=0.2641(0.062862), HSTSA OBW=2.6e+06

PSW=Gaussian Sigma 1.2, filter len=250, Normalized OBW Diff=0.2359(0.12605), HSTSA OBW=2.6e+06

PSW=Gaussian Sigma 1.2, filter len=500, Normalized OBW Diff=0.24359(0.15128), HSTSA OBW=2.6e+06

PSW=Gaussian Sigma 1.2, filter len=1000, Normalized OBW Diff=0.30769(0.12935), HSTSA OBW=2.6e+06

PSW=Gaussian Sigma 1.6, filter len=50, Normalized OBW Diff=0.13077(0.21771), HSTSA OBW=2.6e+06

PSW=Gaussian Sigma 1.6, filter len=100, Normalized OBW Diff=0.0076923(0.25097), HSTSA OBW=2.6e+06

PSW=Gaussian Sigma 1.6, filter len=250, Normalized OBW Diff=0.04359(0.28186), HSTSA OBW=2.6e+06

PSW=Gaussian Sigma 1.6, filter len=500, Normalized OBW Diff=0.058974(0.21539), HSTSA OBW=2.6e+06

PSW=Gaussian Sigma 1.6, filter len=1000, Normalized OBW Diff=0.028205(0.27881), HSTSA OBW=2.6e+06

PSW=Gaussian Sigma 2.0, filter len=50, Normalized OBW Diff=−0.22525(0.10181), HSTSA OBW=6.6e+06

PSW=Gaussian Sigma 2.0, filter len=100, Normalized OBW Diff=−0.27778(0.14697), HSTSA OBW=6.6e+06

PSW=Gaussian Sigma 2.0, filter len=250, Normalized OBW Diff=−0.29394(0.13787), HSTSA OBW=6.6e+06

PSW=Gaussian Sigma 2.0, filter len=500, Normalized OBW Diff=−0.28788(0.14363), HSTSA OBW=6.6e+06

PSW=Gaussian Sigma 2.0, filter len=1000, Normalized OBW Diff=−0.27172(0.15359), HSTSA OBW=6.6e+06

Figure 16:
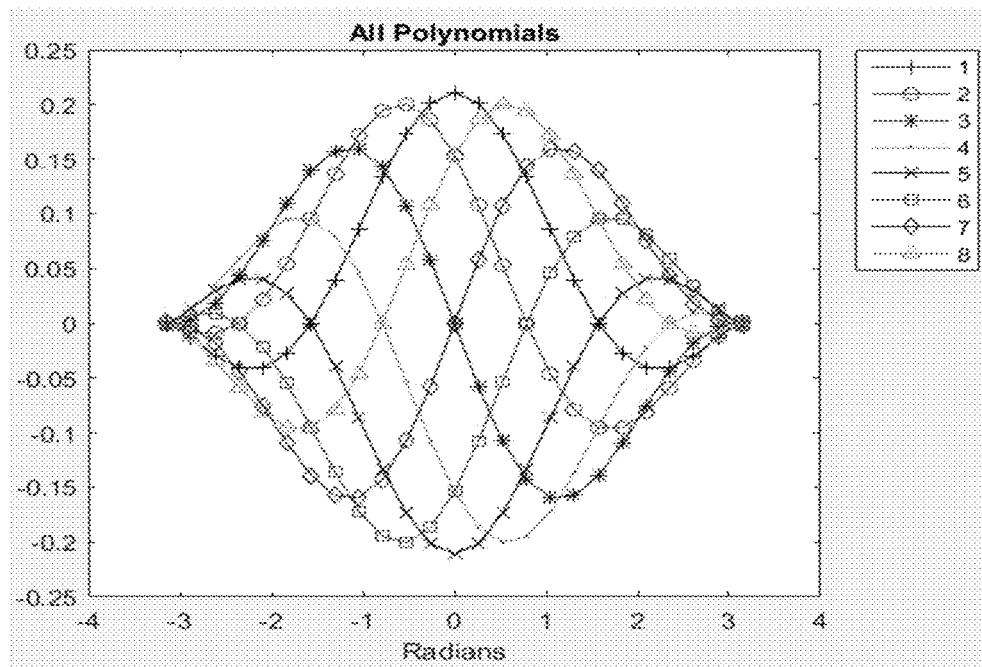
FIG. 16 shows an eight (8) polynomial symbol waveform (PSW) alphabet corresponding to a Root Raised Cosine (RRC)-filtered 8-PSK symbol waveform alphabet.

FIG. 16 shows an eight (8) polynomial symbol waveform (PSW) alphabet corresponding to Root Raised Cosine (RRC)-filtered 8-Phase Shift Keying (PSK) waveforms. PSK waveforms are based on sinusoids with constant amplitude, and therefore produce a relatively stationary spectrum, to within filtering and symbol boundary effects. As such, FP-based spectrum analysis techniques may be used to accurately analyze the PSK signals. The PSW alphabet corresponding to 8-PSK was constructed by starting with 8 sinusoidal polynomials having even phase offsets between them, then convolving with a polynomial corresponding to an RRC with α=0.1.

The SSA of the present invention was used in MATLAB® software simulations to calculate the OBW at 99% power for the 8-PSK waveform. In addition, the OBW was also calculated using the MATLAB® FT-based OBW function called obw. The OBW calculated using the SSA and FT-based techniques were in close agreement to within a few percent. Hence, the present invention has demonstrated good performance for signals with a stationary spectrum when compared to FT-based techniques and for signals with a non-stationary spectrum when compared to HSTSA techniques.

As described herein, the SSA of the present invention may be used in the design and operation of data/information transmission systems. For example, The SSA may be used to display, store, and/or use the frequency spectrum to determine the OBW or other PSD parameters (spectral shape, etc.) of a signal at one or more points in the transmission, e.g., proximate the transmitter, receivers, between the transmitter and receivers, etc. in the design and operation of a system. The PSD information from the SSA may be used to vary the transmission parameters of the transmitters and receivers in the system 10, such as transmit and receiver power level, frequency channel, etc. For example, if may be desirable to change the frequency channel to reduce the interference from other signals.

In the design phase of the system, a waveform may be selected and used in an actual or simulated transmission between a transmitter and one or more receivers by using the PSD output of SSA to adjust waveforms by adjusting various coefficients and/or roots of the waveforms, which may be polynomials, exponentials, etc. As described in U.S. Pat. No. 10,848,364, incorporated above, the OBW or other output from the SSA may be considered a goodness measure in identifying waveforms for transmission. For example, a set of waveforms are identified and the SSA is used to determine the OBW and/or other PSD parameters related to the transmission performance, then the OBW is compared to a prior calculation of the OBW to determine which set of waveforms has a better goodness measure, such as a lower OBW, higher signal to noise ratio, etc. New waveforms may be generated by interactively varying the coefficients and/or roots of the current waveforms, calculating the OBW for the new waveform, comparing the OBW to a currently stored waveform and replacing the stored waveform with the new waveform if the OBW (other transmission parameter) for the new waveform is less than the currently stored waveform. The interactive procedure may be continued until a certain goodness measure of the transmission performance is achieved (e.g., target OBW, spectral shape, etc.) or a local or absolute maxima or minima for one or more signal characteristics, e.g., OBW, BER, or other goodness measure, is maintained for a given number of iterations.

Similarly, in operation, the SSA may be used to adjust various transmission parameters of channels in the system, such as signal power, frequency, waveforms, etc. to optimize the received signal quality, such as signal to noise ratio, OBW, etc., manually by a user and/or automatically by the system. During the turn up of a system or a channel in the system, the SSA may be employed to characterize the transmission performance of various waveforms, such as OBW, signal to noise ratio, interference, etc. The transmission performance information may be stored and used by a user and/or the system to adjust waveforms, as well as transmit signal power for a waveform to change the received signal quality.

As a performance monitor, the SSA may be used to alert the system and/or user that one or more PSD measurements from the channels in the system are varying outside of a predetermined range. The user and/or system may be configured to take action based on the PSD measurements from the SSA to bring the PSD measurements back into range by varying the waveforms used and/or changing transmission characteristics, such as signal power, channel frequency, etc.

The present invention may be deployed in a wide range of applications and systems where spectrum analysis may be desired, such as interference and spectrum monitoring or clearance, object tracking, transmission channel and noise analyses, radiated power analysis, signal boundary interference, satellite downlink signal identification, pulsed radar monitoring, moving object audio detection and identification, lidar, sonar, etc.

In various signal identification applications, the spectrum analyzer receives an input signal, which may be from an antenna or optical-electrical converter depending upon the frequency of the signal to be analyzed, as noted above. The input signal is analyzed using one of the processes described above to generate an input signal PSD spectrum over the frequency range of interest. The generated PSD may be date and time stamped, stored in one or more local or remote storage devices, and compared with spectra of known signals which may be stored in a proximate or remote database in one or more storage devices, and displayed to users via one or more displays that may be physically packaged with the SSA and/or separate displays that may be local or remote from the SSA processors.

If the comparison identifies matching spectra from a known or unknown source in the signal spectra database, the input signal may be identified as and/or associated with the identity of the matching spectra. The matching spectra may be displayed or otherwise provided to users of the system for information, confirmation, and further use by the user or the system. In terms of signal analysis, a matching signal may have the same, substantially the same, or sufficiently similar spectral distribution of power, which may be quantitatively determined by a percentage correspondence between the spectra as is known in the art. A confidence level may be assigned to the input signal and the signals from known sources in the database based on the comparison of the spectra.

If the comparison does not identify a match, e.g., low correspondence or confidence, then the PSD spectra may be labelled as unknown or otherwise and stored for later comparison. The PSD may also be displayed or otherwise provided to the user for review, characterization, annotation, and other processing by the user or the system.

FIG. 17 depicts exemplary embodiments of the receiver 14 including an SSA 34 that may be employed in interference and spectrum monitoring and clearance applications. It will be appreciated that the receiver 14 and SSA 34 may be physically separate or integrated devices and that the SSA 34 may employ one or more processors each performing one or more processes, even though some processes are depicted as separate in FIG. 17.

The receiver 14 may include an antenna, microphone, or other signal collector 32 to receive incoming signals, such as RF, audio, optical, etc., SIGin having a center frequency f_c over a frequency range for the specific application. Depending upon the incoming signal to be analyzed, the collector may be the signal collector is an antenna, a microphone, an optical-electrical converter, an electrical input, other transducers, or another collector suitable to receive or collect the incoming signal.

The received signal SIGin may be filtered using a bandpass filter 36 to eliminate unwanted frequencies. While the bandpass filter 36 is depicted within the SSA 34, the bandpass filter 36 does not need to be used or may be embodied as one or more hardware-based filters. Similarly, a power normalization block is not shown in the FIG. 17 embodiments, but may be included in such embodiments to produce a normalized input signal, SIGin normal.

When the incoming signal is an analog signal, the analyzer may include an analog to digital (A/D) converter to convert the incoming analog signal to a digital signal. The incoming signal may be filtered using an analog filter before the A/D converter or using a digital filter after the A/D converter.

The filtered received signal SIGin_filtered may then be downconverted from the frequency range of the application for each frequency bin, f_source, e.g., 900 MHz, to the target frequency, f_target, e.g., 100 kHz, using a mixing signal or function, cos_mix at frequency f_mix using a mixer 38. The downconverted signal sigIF at the target frequency f_target may be filtered using the software intermediate frequency bandpass filter ifbpf 40 prior to determining the signal power in each frequency bin.

It will be appreciated by one of ordinary skill, that the filters 36 and 40 and the mixer 38 may be implemented in hardware, software, or combinations thereof. For example, in various embodiments, the SSA 34 may be implemented in software after the antenna 32 or other signal receiver in hardware systems and all in software for software simulated systems.

A processing and calibration block 42 may process and use the bin power measurements employing one or more of the preceding methods to determine the OBW, spectral distribution, calibrate the SSA 34, etc. as desired by the skilled artisan, and output the information for use and/or for further processing, etc. It will be appreciated that, while not shown for ease of illustration, the SSA 34 may include memory/storage that may be accessible at some or all stages of signal processing.

In monitoring and clearance applications, the system 10 may include the receiver 14 with an integrated or separate SSA. The signal spectrum determined by the SSA may be compared against a known or expected spectrum to determine whether a system is operating properly, as well as whether unexpected signals are being received. A scanning directional antenna may be employed to locate the source of the unexpected signals by determining the signal direction in which the unexpected signals have the highest power levels and/or other metrics. Spectrum clearing may be conducted with specific threshold power levels where an unexpected signal might be considered problematic. The threshold values may be only a few dBs above the noise floor. Unexpected signals below a threshold limit may be flagged or trigger warnings and alerts. The spectrum monitoring may be used to eliminate the unexpected signals from data collection and analysis, which may be especially important when the unexpected signal is non-stationary. Equivalent Isotropic Radiated Power (EIRP) analyses may be performed when assessing the source of the unexpected signals.

Locating an interfering source of unexpected signals may be accomplished utilizing an off-the-shelf Yagi or Discone antenna and triangulating the unexpected signal source. An external noise source (tone) can be configured to emit an audio signal that changes in pitch and volume as the power of the interfering signal changes. By connecting a Yagi (or other) antenna to the present invention and sweeping the antenna in a systematic pattern in the direction of the interfering signal, then noting the antenna direction when the tone is at a maximum, makes it possible to quickly identify the precise direction from which the signal is coming.

Geo-locating RF signals of interest may be performed using Power of Arrival (POA), Time Difference of Arrival (TDOA), or Angle of Arrival (AOA). In situations where modulated signal bandwidths are greater than 25 kHz, including those associated with drone detection and mitigation, TDOA may be most accurate. TDOA can provide a very precise location estimate to within approximately 100 meters in a short period of time. The TDOA results depend on the geometry of the measurement based upon the probes and source locations; the sources of uncertainty and how to mitigate them; and how to detect if the answer is meaningful. Each measurement updates the signal position to provide tracking points for the path taken, so the faster the data can be processed the greater the success, which is important for fast moving objects, such as drones.

FIG. 18 shows embodiments in which the SSA of the present invention may be implemented in a radar system 10 to monitor the spectrum for a wide array in both military and civilian applications such as motion detection, proximity fuses (IDE), tracking, navigation, wind-shear and weather prediction. Spectrum monitoring of the present invention may be employed with the radar system to eliminate the constant spectrum assumptions in present systems and to provide more detailed information on movements of interest. Similar arrangements may be employed in satellite communications, the SSA may be employed in downlink signal monitoring, discovery, and identification, as well as lidar and sonar monitoring systems.

As depicted in FIG. 19, the SSA of the present invention may be employed in various transmission system applications to support various analyses, such as for harmonics, spurious noise, channel power, adjacent channel analysis, occupied bandwidth measurement, as well as sound detection systems. The antenna 32 may be implemented as (a) antenna, and various collectors (b)-(f) having different polarizations (E and/or H) depending on the signals to be collected.

In cellular (e.g., 3G/4G/5G) applications, base station transmitters generate side lobes that can cause interference in other cells, e.g. signal boundary interference. The SSA may be used to measure the side lobe power levels to ensure that when high-powered signals are transmitted the side lobes are below a strength level threshold where they would cause interference. In sound detection applications for moving objects, such as drones and bird detection and identification, the moving object (e.g., drone, bird) may be identified by distance, movement, phase, amplitude and sound using AOA, TDOA and PDOA. Sound analysis, variability in statistical history (mean, standard deviation and variance) may be conducted using information derived from the nonstationary spectrum data provided by the SSA, such as zero crossing rate, autocorrelation, and energy signatures.

Various actions may be taken based on the comparison and identification of signals received by the system and processed by the SSA. For example, the bird detection may be used to deploy animal control assess to clear birds or other wildlife from an area, such as near airport runways. Aircraft detection may be used to deploy anti-aircraft assets. Unidentified or unidentifiable signals may be used to deploy assets to investigative the source and nature of the signals.

Many embodiments may be described herein in terms of sequences of actions to be performed by, for example, elements of a computing device. It will be recognized that various actions described herein can be performed by specific circuits (e.g., application specific integrated circuits (ASICs)), by field programmable gate arrays, by program instructions being executed by one or more processors, or by a combination thereof. Additionally, sequence(s) of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action. For example, it will be appreciated that analyzers, transmitter, receivers, management systems, and other devices in systems of the present invention may include one or more processors, memory, storage, input and components, communication interfaces, as well as other components that may be interconnected as desired by the skilled artisan via one or more buses and circuit boards, cards, etc.

Figure 20:
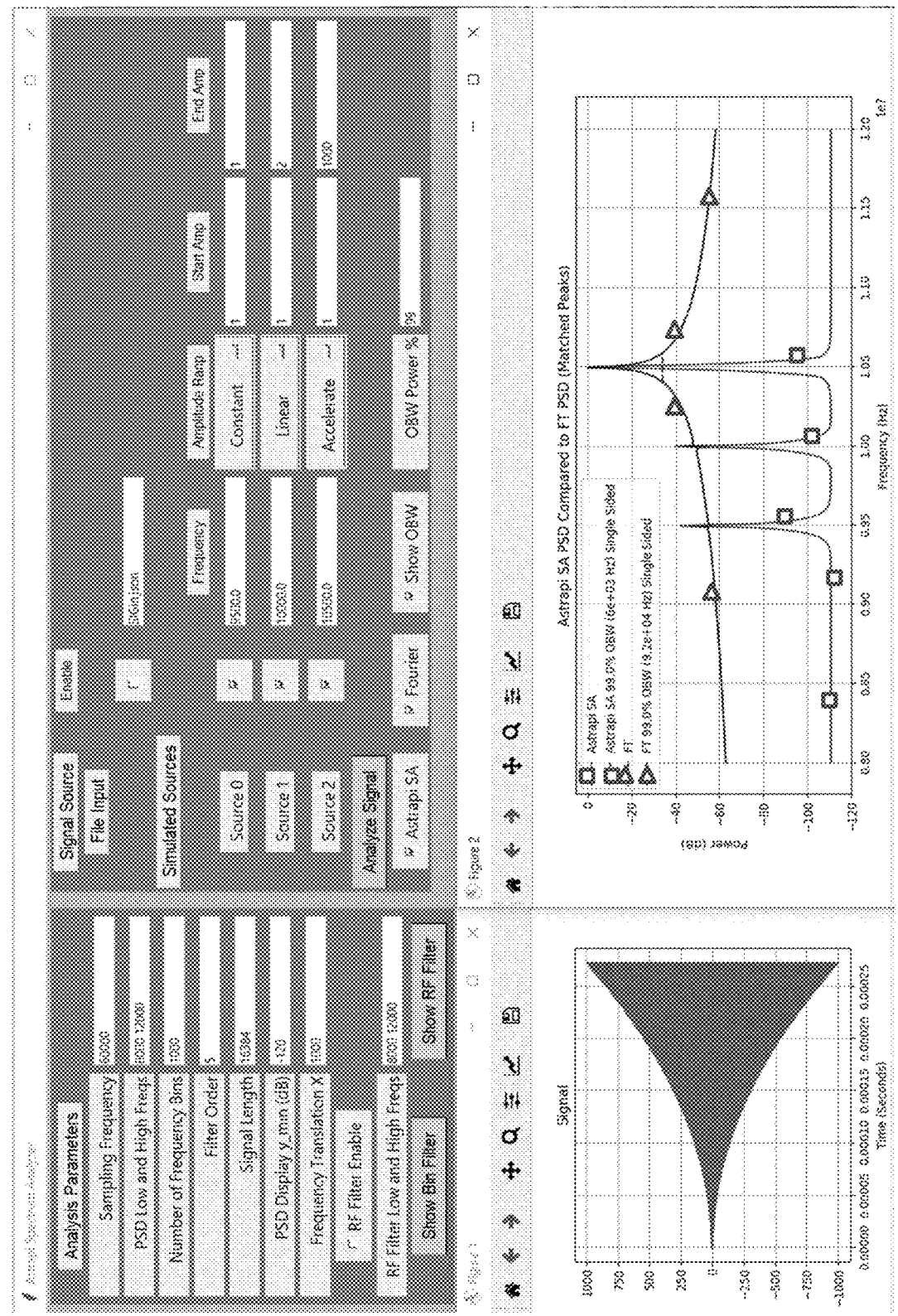
FIGS. 20-21 are simulations showing the measured PSD of one and three signals using the SSA (Astrapi) and FT.
Figure 21:
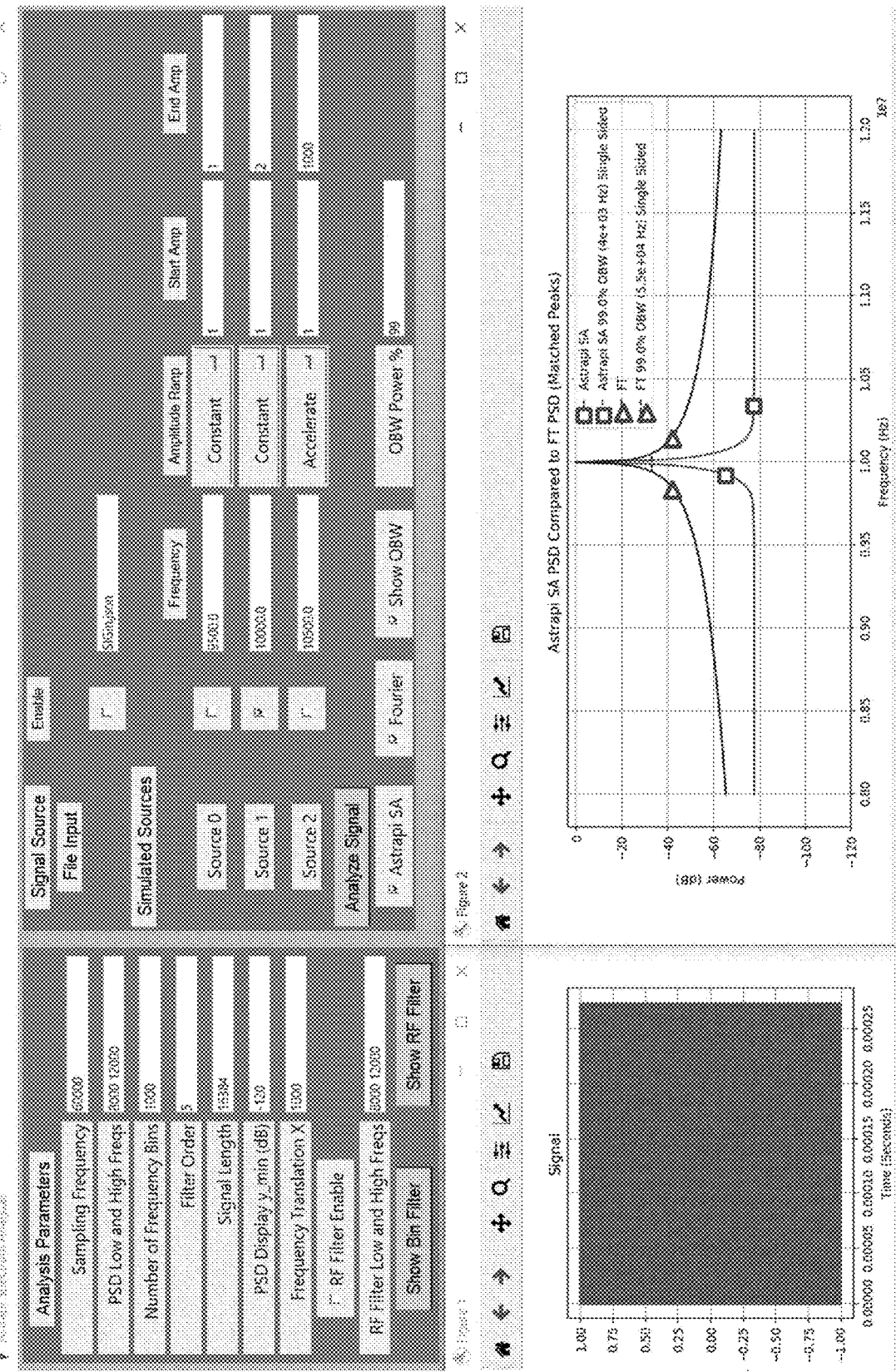

FIGS. 20-21 are simulations showing the measured PSD of one and three signals using the SSA (Astrapi) and FT. As can be seen the SSA provides far better resolution than the FT analyzer, because the SSA does not assume a stationary spectrum like the FT analyzer.

Figure 22:
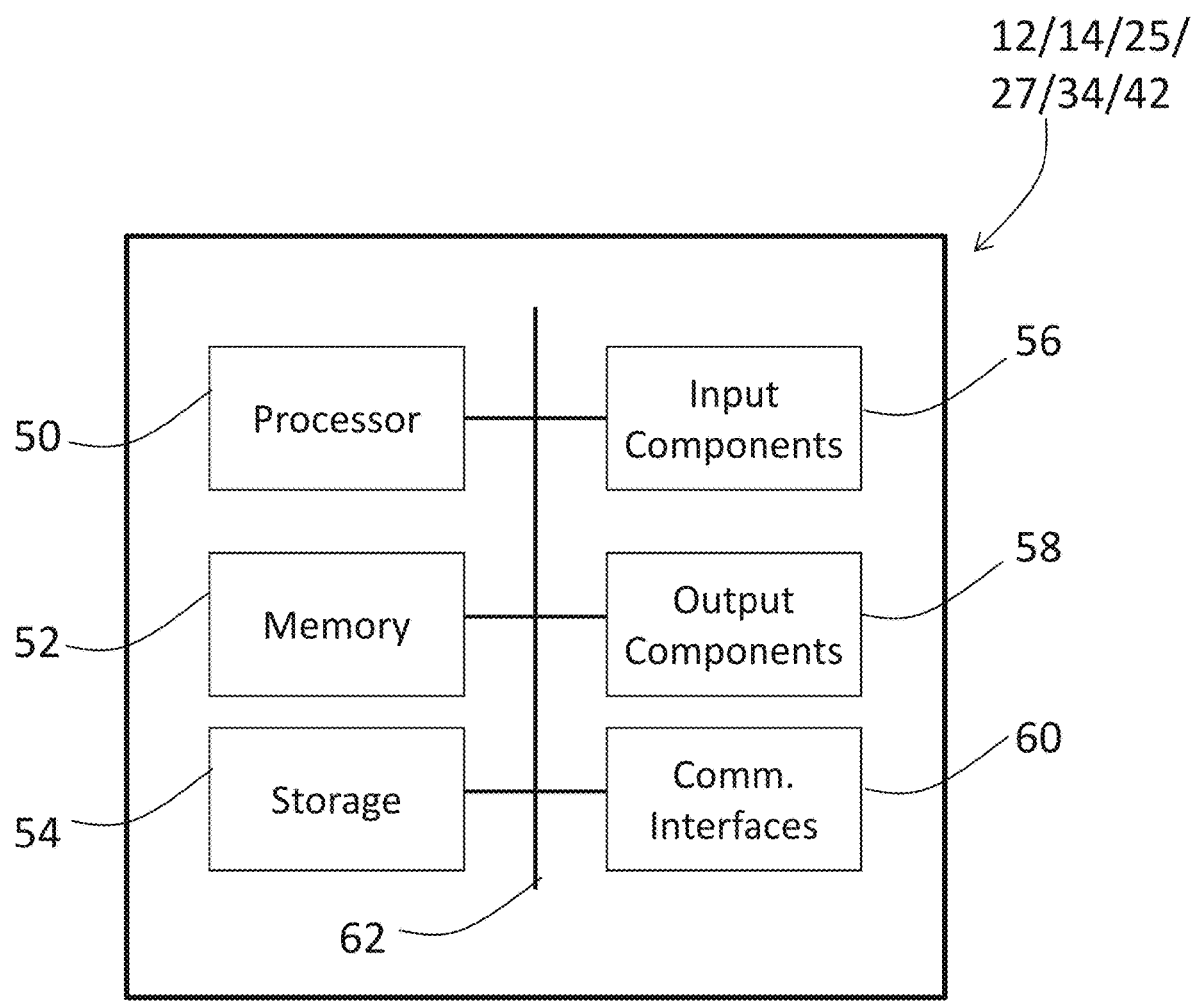
FIG. 22 exemplary component embodiments of various computing resources.

FIG. 22 illustrates exemplary component embodiments of various computing resources that may be employed in the devices, systems, and methods of the present invention and applications thereof. The computing resources may each include one or more processors 50, memory 52 and other storage 54, input components 56, output components 58, communication interfaces 60, as well as other components that may be interconnected as desired by the skilled artisan via one or more buses 62. As previously described, the components of the various computing resources may often be configured as a single device or multiple interdependent or stand-alone devices in close proximity and/or distributed over geographically remote areas.

Processor(s) 50 may include one or more general or Central Processing Units ("CPU"), Graphics Processing Units ("GPU"), Accelerated Processing Units ("APU"), microprocessors, and/or any processing components, such as a Field-Programmable Gate Arrays ("FPGA"), Application-Specific Integrated Circuits ("ASIC"), etc., that interpret and/or execute logical functions. The processors 50 may contain cache memory units for temporary local storage of instructions, data, or computer addresses and may be implemented as a single-chip, multiple chips and/or other electrical components including one or more integrated circuits and printed circuit boards that implements and executes logic in hardware, in addition to executing software.

Processor(s) 50 may connect to other computer systems and/or to telecommunications networks as part of performing one or more steps of one or more processes described or illustrated herein, according to particular needs. This can be accomplished through APIs or other methods, using FHIR format or other health-specific format. Moreover, one or more steps of one or more processes described or illustrated herein may execute solely at the processor 50. In addition, or as an alternative, one or more steps of one or more processes described or illustrated herein for execution in one processor may be executed at multiple CPUs that are local or remote from each other across one or more networks.

The computing resources of the system 15 may implement processes employing hardware and/or software to provide functionality via hardwired logic or otherwise embodied in circuits, such as integrated circuits, which may operate in place of or together with software to execute one or more processes or one or more steps of one or more processes described or illustrated herein. Software implementing particular embodiments may be written in any suitable programming language (e.g., procedural, object oriented, etc.) or combination of programming languages, where appropriate.

Storage may include various types of memory 52, e.g., Random Access Memory ("RAM"), Read Only Memory ("ROM"), and/or another type of dynamic or static memory devices, such as flash, magnetic, and optical memory, etc. that stores information and/or instructions for use by processor 50. The memory 52 may include one or more memory cards that may be loaded on a temporary or permanent basis. Memory 52 and storage 54 may include a Subscriber Identification Module ("SIM") card and reader.

Other storage components 54 may be used to store information, instructions, and/or software related to the operation of the system 15 and computing resources. Storage 54 may be used to store operating system, executables, data, applications, and the like, and may include fast access primary storage, as well as slower access secondary storage, which may be virtual or fixed.

Storage component(s) 54 may include one or more transitory and/or non-transitory computer-readable media that store or otherwise embody software implementing particular embodiments. The computer-readable medium may be any tangible medium capable of carrying, communicating, containing, holding, maintaining, propagating, retaining, storing, transmitting, transporting, or otherwise embodying software, where appropriate, including nano-scale medium. The computer-readable medium may be a biological, chemical, electronic, electromagnetic, infrared, magnetic, optical, quantum, or other suitable medium or a combination of two or more such media, where appropriate. Example computer-readable media include, but are not limited to fixed and removable drives, ASIC, Compact Disks ("CDs"), Digital Video Disks ("DVDs"), FPGAs, floppy disks, optical and magneto-optic disks, hard disks, holographic storage devices, magnetic tape, caches, Programmable Logic Devices ("PLDs"), Secure Disk Cards ("SD Cards"), RAM devices, ROM devices, semiconductor memory devices, solid state drives, cartridges, and other suitable computer-readable media.

Input components 56 and output components 58 may include various types of Input/Output ("I/O") devices. The I/O devices often may include a Graphical User Interface ("GUI") that provides an easy to use visual interface between the user and system 15 and access to the operating system or application(s) running on the devices.

Input components 56 receive any type of input in various forms from users or other machines, such as touch screen and video displays, keyboards, keypads, mice, buttons, track balls, switches, joy sticks, directional pads, microphones, cameras, transducers, card readers, voice and handwriting inputs, and sensors for sensing information such as biometrics, temperature 86 other environmental conditions, such as air quality, etc., location via Global Positioning System ("GPS") or otherwise, accelerometer, gyroscope, compass, actuator data, which may be input via a component in the computing resource and/or received via one or more communication interfaces 60.

Output component 58 may include displays, speakers, lights, sensor information, mechanical, or other electromagnetic output. Similar to the input, the output may be provided via one or more ports and/or one or more communication interfaces 60.

Communication interface 60 may include one or more transceivers, receivers, transmitters, modulators, demodulators that enable communication with other devices, via wired and/or wireless connections. Communication interface 60 may include Ethernet, optical, coaxial, Universal Serial Bus ("USB"), Infrared ("IR"), Radio Frequency ("RF") including the various Wi-Fi, WiMax, cellular, and Bluetooth protocols, such as Bluetooth, Bluetooth Low Energy (BLE), Wi-Fi (IEEE 802.11), Wi-Fi Direct, Super-WiFi, 802.15.4, WiMax, LTE systems, LTE Direct, past, current, and future cellular standard protocols, e.g., 4-5G, or other wireless signal protocols or technologies as described herein and known in the art.

Bus(es) 62 may connect a wide variety of other subsystems, in addition to those depicted, and may include various other components that permit communication among the components in the computing resources. The bus(es) 62 may encompass one or more digital signal lines serving a common function, where appropriate, and various structures including memory, peripheral, or local buses using a variety of bus architectures. As an example and not by way of limitation, such architectures include an Industry Standard Architecture ("ISA") bus, an Enhanced ISA ("EISA") bus, a Micro Channel Architecture ("MCA") bus, a Video Electronics Standards Association Local Bus ("VLB"), a Peripheral Component Interconnect ("PCI") bus, a PCI-eXtended ("PCI-X") bus, a Peripheral Component Interconnect Express (PCIe) bus, a Controller Area Network ("CAN") bus, and an Accelerated Graphics Port ("AGP") bus.

The computing resources of the system 15 may provide functionality as a result of the processors 50 executing software embodied in one or more computer-readable storage media residing in the memory 52 and/or storage 54 and logic implemented and executed in hardware. The results of executing the software and logic may be stored in the memory 52 and/or storage 54, provided to output components 58, and transmitted to other devices via communication interfaces 60, which includes cloud storage and cloud computing. In execution, the processor 50 may use various inputs received from the input components 56 and/or the communications interfaces 60. The input may be provided directly to the processor 50 via the bus 62 and/or stored before being provided to the processor 50. Executing software may involve carrying out processes or steps may include defining data structures stored in memory 52 and modifying the data structures as directed by the software.

As used herein, the term component is intended to be broadly construed as hardware, firmware, software, and/or combinations thereof. It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Certain user interfaces have been described herein and/or shown in the figures. A user interface may include a graphical user interface, a non-graphical user interface, a text-based user interface, etc. A user interface may provide information for display. In some implementations, a user may interact with the information, such as by providing input via an input component of a device that provides the user interface for display. In some implementations, a user interface may be configurable by a device and/or a user (e.g., a user may change the size of the user interface, information provided via the user interface, a position of information provided via the user interface, etc.). Additionally, or alternatively, a user interface may be pre-configured to a standard configuration, a specific configuration based on a type of device on which the user interface is displayed, and/or a set of configurations based on capabilities and/or specifications associated with a device on which the user interface is displayed.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, etc.

The word "exemplary" is used herein to mean "serving as an example, instance, or illustration" and not as a limitation. Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items and may be used interchangeably with "one or more." Furthermore, as used herein, the term "set" is intended to include one or more items and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

The foregoing disclosure provides examples, illustrations and descriptions of the present invention, but is not intended to be exhaustive or to limit the implementations to the precise form disclosed. Modifications and variations are possible in light of the above disclosure or may be acquired from practice of the implementations. These and other variations and modifications of the present invention are possible and contemplated, and it is intended that the foregoing specification and the following claims cover such modifications and variations.

What is claimed is:

1. A frequency spectrum analyzer comprising:
 a signal collector to receive an input signal, SIGin; and
 at least one processor to:
  receive an input signal, SIGin, from the input over a time interval, dt, and having a signal length, sig_len, and power distributed over an input frequency spectrum;
  segmenting the input frequency spectrum into a plurality of frequency bins;
  calculate, for each frequency bin,
   a mixing frequency, f_mix, where
    f_mix=f_source−f_target, where
     f_target=a target intermediate frequency for signal in the frequency bin,
     f_source=a frequency associated with the frequency bin,
   and a mixing stream, cos_mix, where
    cos_mix=cos(0:rads_per_sample:rads_per_signal), and where
    rads_per_sample=f_mix*dt*2*π,
    rads_per_signal=rads_per_sample*(sig_len−1);
  generate, for each frequency bin, an intermediate frequency signal, sig_IF=SIGin*cos_mix;
  apply, for each frequency bin, an intermediate frequency (IF) bandpass filter, ifbpf, to sig_IF to generate a filtered IF signal, sig_IF_filtered;
  calculate, for each frequency bin, a bin power, bin power, of the filtered IF signal by summing the square of the amplitudes in filtered IF signal and dividing this sum by the time interval, dt;
  generate a signal frequency power spectrum based on the calculated bin power for the input signal;
  at least one of display, via a display, and store, via storage, the generated frequency power spectrum;
  compare the signal frequency power spectrum to a frequency spectrum from at least one known source retrieved from the storage; and
  identify to a user known sources having the same frequency spectrum as the generated frequency spectrum based on the comparison; and
 a display in communication with the at least one processor to display at least one the generated frequency spectrum the frequency spectrum from the at least one known source.

2. The analyzer of claim 1, where the analyzer is part of one of a radar system, a lidar system, a sonar system, object tracking system, object detection system, terrestrial wireless communication system, satellite wireless communication system, signal detection system and signal monitoring system.

3. The analyzer of claim 1, where the input signal, SIGin, is at least one of filtered and normalized, and the at least one of filtered and normalized input signal is used to calculate the intermediate frequency signal in lieu of SIGin.

4. The analyzer of claim 1, where the bin power in each frequency bin is calculated in parallel.

5. The analyzer of claim 1, further comprising:
 a storage device in communication with the at least one processor to store at least the generated frequency spectrum.

6. The analyzer of claim 1, where
 the at least one processor identifies known sources having a similar frequency spectrum as the generated frequency spectrum based on a confidence level.

7. The analyzer of claim 1, where
 the signal collector is one of an antenna, a microphone, an optical-electrical converter, a transducer, and an electrical input.

8. The analyzer of claim 1, further comprising:
 an analog to digital converter to convert the input signal from an analog to a digital converter.

9. The analyzer of claim 1, where
 a time interval, dt, and having a signal length, sig_len are configurable by a user.

10. The analyzer of claim 1, where
 f_source−f_target are configurable by a user.

11. A method of identifying a signal using frequency spectrum analysis comprising:
 receiving, via a signal collector, an input signal, SIGin over a time interval, dt, and having a signal length, sig_len, and power distributed over an input frequency spectrum;
 segmenting, via at least one processor, the input frequency spectrum into a plurality of frequency bins;
 calculating, via at least one processor, for each frequency bin,
  a mixing frequency, f_mix, where
   f_mix=f_source−f_target, where
    f_target=a target intermediate frequency for signal in the frequency bin,
    f_source=a frequency associated with the frequency bin,
  and a mixing stream, cos_mix, where
   cos_mix=cos(0:rads_per_sample:rads_per_signal), and where
   rads_per_sample=f_mix*dt*2*π,
   rads_per_signal=rads_per_sample*(sig_len−1);
 generating, via at least one processor, for each frequency bin, an intermediate frequency signal, sig_IF=SIGin*cos_mix;
 applying, via at least one processor, for each frequency bin, an intermediate frequency (IF) bandpass filter, ifbpf, to sig_IF to generate a filtered IF signal, sig_IF_filtered;
 calculating, via at least one processor, for each frequency bin, a bin power, bin power, of the filtered IF signal by summing the square of the amplitudes in filtered IF signal and dividing this sum by the time interval, dt;
 generating, via at least one processor, a signal frequency power spectrum based on the calculated bin power for the input signal;
 at least one of displaying, via a display, and storing, via storage, the generated frequency power spectrum;
 comparing, via at least one processor, the signal frequency power spectrum to a frequency spectrum from at least one known source retrieved from the storage; and
 identifying, via at least one processor, to a user known sources having the same frequency spectrum as the generated frequency spectrum based on the comparison.

12. The method of claim 11, further comprising:
 storing, in a storage device via the at least one processor, the generated frequency spectrum identified as one of a known source and an unknown source.

13. The method of claim 11, where
identifying includes identifying known sources having a similar frequency spectrum as the generated frequency spectrum based on a confidence level.

14. A non-transitory computer readable medium storing instructions, the instructions comprising:
one or more instructions which, when executed by one or more processors, cause the one or more processors to:
receive an input signal, SIGin, over a time interval, dt, and having a signal length, sig_len, and power distributed over an input frequency spectrum;
segment the input frequency spectrum into a plurality of frequency bins;
calculate, for each frequency bin,
a mixing frequency, f_mix, where
f_mix=f_source−f_target, where
f_target=a target intermediate frequency for signal in the frequency bin,
f_source=a frequency associated with the frequency bin,
and a mixing stream, cos_mix, where
cos_mix=cos(0:rads_per_sample:rads_per_signal), and where
rads_per_sample=f_mix*dt*2*π,
rads_per_signal=rads_per_sample*(sig_len−1);
generate, for each frequency bin, an intermediate frequency signal, sig_IF=SIGin*cos_mix;
apply, for each frequency bin, an intermediate frequency (IF) bandpass filter, ifbpf, to sig_IF to generate a filtered IF signal, sig_IF_filtered; and
calculate, for each frequency bin, a bin power, bin power, of the filtered IF signal by summing the square of the amplitudes in filtered IF signal and dividing this sum by the time interval, dt;
generate a signal frequency power spectrum based on the calculated bin power for the input signal;
at least one of display and store the generated frequency power spectrum;
compare the generated signal frequency power spectrum to a frequency spectrum from at least one known source retrieved from the storage; and
identify to a user known sources having the same frequency spectrum as the generated frequency spectrum based on the comparison.

15. The non-transitory computer readable medium of claim 14, where the one or more processors is part of one of a radar system, a lidar system, a sonar system, object tracking system, object detection system, terrestrial wireless communication system, satellite wireless communication system, signal detection system and signal monitoring system.

16. The non-transitory computer readable medium of claim 14, where the intermediate frequency (IF) is the same for each frequency bin.

17. The non-transitory computer readable medium of claim 14, where each frequency bin has the same frequency width.

18. The non-transitory computer readable medium of claim 14, where the same input signal, SIGin, is used to calculate the power in each frequency bin.

* * * * *